United States Patent
Meyer Timmerman Thijssen et al.

(10) Patent No.: US 11,852,853 B2
(45) Date of Patent: Dec. 26, 2023

(54) ETCH IMPROVEMENT

(71) Applicant: Applied Materials, Inc., Santa Clara, CA (US)

(72) Inventors: Rutger Meyer Timmerman Thijssen, Sunnyvale, CA (US); Morgan Evans, Manchester, MA (US); Maurice Emerson Peploski, Potsdam, NY (US); Joseph C. Olson, Beverly, MA (US); Thomas James Soldi, West Simsbury, CT (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

(21) Appl. No.: 17/147,338

(22) Filed: Jan. 12, 2021

(65) Prior Publication Data
US 2021/0247554 A1   Aug. 12, 2021

Related U.S. Application Data

(60) Provisional application No. 62/971,811, filed on Feb. 7, 2020.

(51) Int. Cl.
*G02B 5/18* (2006.01)
*H01J 37/305* (2006.01)

(52) U.S. Cl.
CPC ........ *G02B 5/1857* (2013.01); *H01J 37/3056* (2013.01)

(58) Field of Classification Search
CPC .................. G02B 5/1857; G02B 27/0081; H01J 37/3056
USPC ...................................................... 204/192.34
See application file for complete search history.

(56) References Cited

U.S. PATENT DOCUMENTS

| | | | |
|---|---|---|---|
| 5,116,461 | A | 5/1992 | Lebby et al. |
| 10,302,826 | B1 | 5/2019 | Meyer et al. |
| 2012/0228515 | A1 | 9/2012 | Leavitt et al. |
| 2016/0035539 | A1 | 2/2016 | Sainiemi et al. |
| 2016/0111294 | A1 | 4/2016 | Berry, III et al. |
| 2019/0258008 | A1 | 8/2019 | Hautala et al. |

FOREIGN PATENT DOCUMENTS

| | | |
|---|---|---|
| CN | 107564810 A | 1/2018 |
| JP | S61-245452 A | 10/1986 |
| WO | 2019231576 A | 12/2019 |

OTHER PUBLICATIONS

International Search Report & Written Opinion dated May 12, 2021 for PCT/US2021/013086.
Office Action, dated Sep. 5, 2023, for Japanese Patent Application No. 2022-547193.

*Primary Examiner* — Rodney G McDonald
(74) *Attorney, Agent, or Firm* — Patterson + Sheridan, LLP

(57) ABSTRACT

A method is provided. The method includes exposing a first material disposed across a first plane on a first substrate to an ion beam to form a first plurality of structures in the first material, the ion beam directed at the first material at an ion beam angle $\vartheta$ relative to a surface normal of the first substrate. The first substrate is positioned at a first rotation angle $\phi_1$ between the ion beam and a first vector of the first plurality of structures, the first material is exposed to the ion beam incrementally along a first direction, and exposure of the first material to the ion beam is varied along the first direction to generate a depth variation between the first plurality of structures in the first direction.

20 Claims, 11 Drawing Sheets

ETCH IMPROVEMENT

CROSS-REFERENCE TO RELATED APPLICATIONS

This application claims benefit of U.S. provisional patent application Ser. No. 62/971,811, filed Feb. 7, 2020, which is hereby incorporated herein by reference.

BACKGROUND

Field

Embodiments of the present disclosure generally relate to angled etch tools. More specifically, embodiments described herein relate to using angled etch tools to form structures of optical devices.

Description of the Related Art

To form structures with different slant angles, such as fins of one or more gratings, on a substrate, angled etch systems can be used. One example of an angled etch system is an ion beam chamber that houses an ion beam source. The ion beam source is configured to generate an ion beam, such as a ribbon beam, a spot beam, or full substrate-size beam. The ion beam chamber is configured to direct the ion beam at an angle relative to a surface normal of a substrate to generate a structure having a specific slant angle. Changing the slant angle of the structure to be generated by the ion beam requires substantial hardware reconfiguration of the of the ion beam chamber.

Optical devices may include different structures with different slant angles. Thus, to form one optical device including different structures with different slant angles requires substantial hardware reconfiguration. Furthermore, fabricating an optical device having structures with different slant angles than a previously fabricated optical device encounters similar problems.

Forming optical devices that include different structures having different depths across the surface of substrate has conventionally been performed using time-consuming and complex processes, which can add considerable costs to any devices fabricated using the process.

Accordingly, improved methods and related equipment are needed for forming optical devices that include structures with different depths or different depths and different slant angles across a single substrate as well as forming optical devices that include structures with different depths or different depths and different slant angles on successive substrates.

SUMMARY

Embodiments of the present disclosure generally relate to angled etch tools. In one embodiment, a method is provided. The method includes exposing a first material disposed across a first plane on a first substrate to an ion beam to form a first plurality of structures in the first material, the ion beam directed at the first material at an ion beam angle $\vartheta$ relative to a surface normal of the first substrate, wherein: the first substrate is positioned at a first rotation angle $\phi_1$ between the ion beam and a first vector of the first plurality of structures, the first vector is perpendicular to a direction in which the first plurality of structures extend across the first plane, the first material is exposed to the ion beam incrementally along a first direction, and exposure of the first material to the ion beam is varied along the first direction to generate a depth variation between the first plurality of structures in the first direction.

In another embodiment, a method is provided. The method includes exposing a first material disposed across a first plane on a substrate to an ion beam during a first time period to form a first plurality of structures in the first material, the ion beam directed at the first material at an ion beam angle $\vartheta$ relative to a surface normal of the substrate, wherein the substrate is positioned at a first rotation angle $\phi_1$ between the ion beam and a first vector of the first plurality of structures during the first time period and the first vector is perpendicular to a direction in which the first plurality of structures extend across the first plane; and exposing the first material disposed to the ion beam during a second time period, wherein the substrate is positioned at a second rotation angle $\phi_2$ between the ion beam and the first vector of the first plurality of structures during the second time period.

In another embodiment, a method is provided. The method includes exposing a first material disposed across a first plane on a substrate to an ion beam during a first time period to form a first plurality of structures in the first material, the ion beam directed at the first material at an ion beam angle $\vartheta$ relative to a surface normal of the substrate, wherein the substrate is positioned at a first rotation angle $\phi_1$ between the ion beam and a first vector of the first plurality of structures during the first time period, the first vector is perpendicular to a direction in which the first plurality of structures extend across the first plane, the first plurality of structures are formed to have a first slant angle $\vartheta_1'$ relative to a surface normal of the substrate during the first time period, and the first rotation angle $\phi_1$ is selected by an equation $\phi_1 = \cos^{-1}(\tan(\vartheta_1')/\tan(\vartheta))$; and exposing the first material disposed to the ion beam during a second time period, wherein the substrate is positioned at a second rotation angle $\phi_2$ between the ion beam and the first vector of the first plurality of structures during the second time period, wherein the second rotation angle $\phi_2$ is the negative angle of the first rotation angle $\phi_1$, a duty cycle used to generate the ion beam is varied according to a first profile during the first time period, and the duty cycle used to generate the ion beam is varied according to a second profile during the second time period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods of forming structures with different depths or different depths and different slant angles across a single substrate as well as forming optical devices that include structures with different depths or different depths and different slant angles on successive substrates. Although the following is largely described in reference to performing one or more etches to form an optical device (e.g., one or more gratings of a waveguide combiner), the following disclosure can be applied to any process in which one or more etches are used. For example, the following disclosure is applicable to any etch in which structures are formed to have one or more specified slant angles and/or one or more specified depths.

Figure 1:
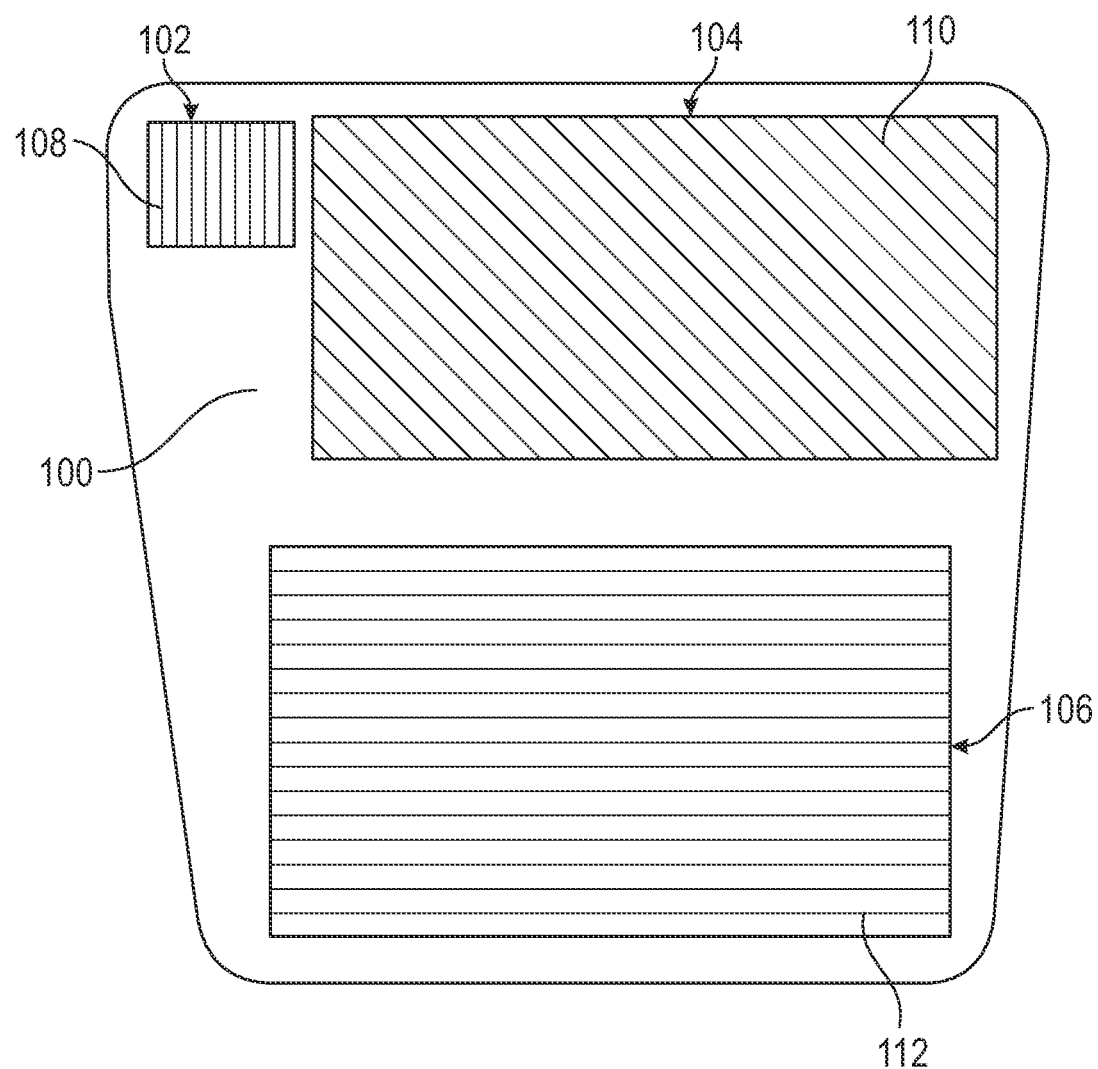
FIG. 1 is a perspective, frontal view of an optical device, according to one embodiment.

FIG. 1 is a perspective, frontal view of an optical device 100, according to one embodiment. Examples of the optical device 100 include, but are not limited to, a flat optical device and a waveguide (e.g., a waveguide combiner). The optical device 100 includes one or more gratings. In one embodiment, which can be combined with other embodiments described herein, the optical device 100 includes an input grating 102, an intermediate grating 104, and an output grating 106. Each of the gratings 102, 104, 106 includes corresponding structures 108, 110, 112 (e.g., fins). In one embodiment, which can be combined with other embodiments described herein, the structures 108, 110, 112 and depths between the structures include sub-micron critical dimensions (e.g., nano-sized critical dimensions).

Figure 2A:
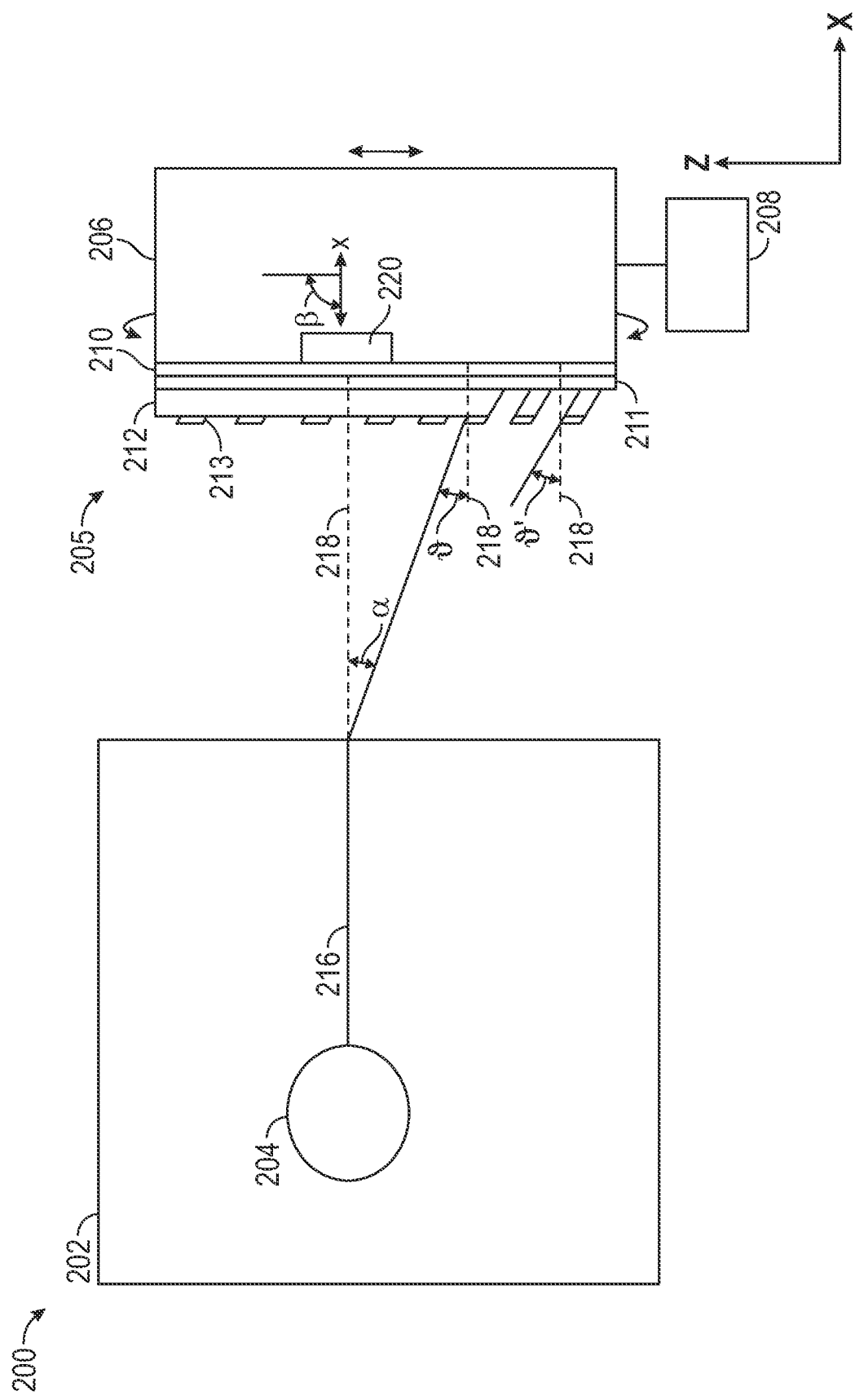
FIG. 2A is a side, schematic cross-sectional of an angled etch system, according to one embodiment.
Figure 2B:
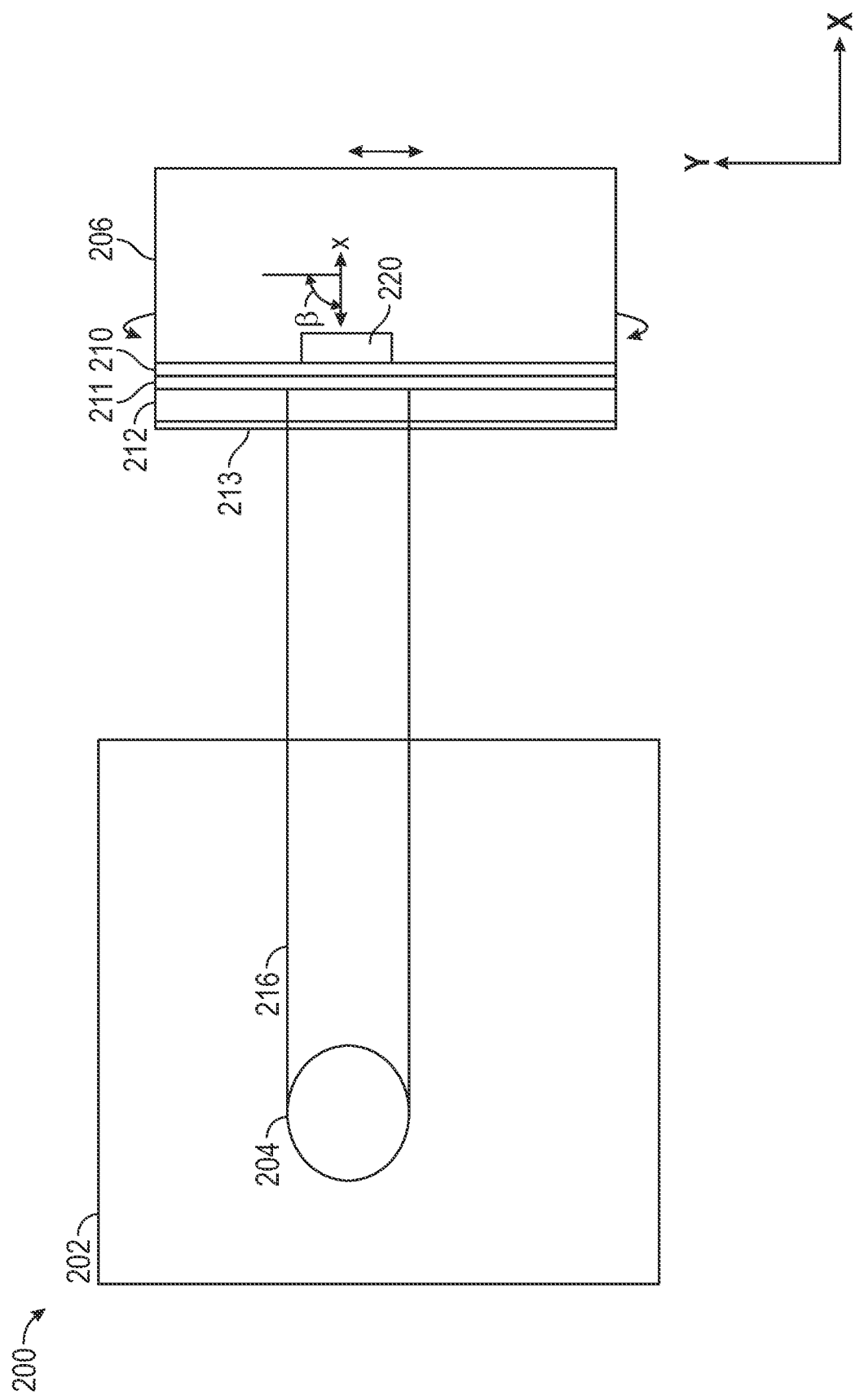
FIG. 2B is a top, schematic cross-sectional view of the angled etch system shown in FIG. 2A, according to one embodiment.

FIG. 2A is a side, schematic cross-sectional view and FIG. 2B is a top, schematic cross-sectional view of an angled etch system 200, such as the Varian VIISta® system available from Applied Materials, Inc. located in Santa Clara, Calif. It is to be understood that the angled etch system 200 described below is an exemplary angled etch system and other angled etch systems, including angled etch systems from other manufacturers, may be used to or modified to form the structures described herein on a substrate.

FIGS. 2A and 2B show a device 205 disposed on a platen 206. The device 205 includes a substrate 210, an etch stop layer 211 disposed over the substrate 210, a grating material 212 disposed across a first plane (YZ plane) over the etch stop layer 211, and a hardmask 213 disposed over the grating material 212. form structures (e.g., fins) having slant angles, the grating material 212 is etched by the angled etch system 200. In one embodiment, the grating material 212 is disposed on the etch stop layer 211 disposed on the substrate 210 and a patterned hardmask 213 is disposed on the grating material 212. In one embodiment, the one or more materials of the grating material 212 are selected based on the slant angle $\vartheta'$ of each structure to be formed and the refractive index of the substrate 210. In some embodiments, the grating material 212 includes one or more of silicon oxycarbide (SiOC), titanium dioxide (TiO$_2$), silicon dioxide (SiO$_2$), vanadium (IV) oxide (VOx), aluminum oxide (Al$_2$O$_3$), indium tin oxide (ITO), zinc oxide (ZnO), tantalum pentoxide (Ta$_2$O$_5$), silicon nitride (Si$_3$N$_4$), titanium nitride (TiN), and/or zirconium dioxide (ZrO$_2$) containing materials. The grating material 212 can have a refractive index between about 1.5 and about 2.65. The examples provided above for the grating material 212 apply to materials used when an optical device is being formed, such as the device 205. More generally, the grating material 212 (also referred to as "first material") is not limited to the materials listed above can be any etchable material. For example, as mentioned at the beginning of this description, the contents of this disclosure are not limited to applications relating to forming optical devices, such as optical device 205, and thus the use of the term first material more generally refers to a material that can be preferentially etched (e.g., by an ion beam) relative to another material, such as a hardmask layer.

In some embodiments, the patterned hardmask 213 is a non-transparent hardmask that is removed after the device 205 is formed. For example, the non-transparent hardmask can include reflective materials, such as chromium (Cr) or silver (Ag). In another embodiment, the patterned hardmask 213 is a transparent hardmask. In one embodiment, the etch stop layer 211 is a non-transparent etch stop layer that is removed after the device 205 is formed. In another embodiment, the etch stop layer 211 is a transparent etch stop layer.

The angled etch system 200 includes an ion beam chamber 202 that houses an ion beam source 204. The ion beam source is configured to generate an ion beam 216, such as a ribbon beam, a spot beam, or full substrate-size beam. The ion beam chamber 202 is configured to direct the ion beam 216 at a first ion beam angle α relative to a surface normal 218 of substrate 210 before the substrate 210 is tilted as described below. Changing the first ion beam angle α requires reconfiguration of the hardware of the ion beam chamber 202. The substrate 210 is retained on a platen 206 coupled to a first actuator 208. The first actuator 208 is configured to move the platen 206 in a scanning motion along a y-direction and/or a z-direction. In one embodiment, the first actuator 208 is further configured to tilt the platen 206, such that the substrate 210 is positioned at a tilt angle β relative to the x-axis (e.g.; rotate about the Y-axis) of the ion beam chamber 202. In some embodiments, the first actuator 208 can further be configured to tilt the platen 206 relative to the y-axis and/or z-axis.

The first ion beam angle α and the tilt angle β result a second ion beam angle ϑ relative to the surface normal 218 of the substrate 210 after the substrate 210 is tilted. To form structures having a slant angle ϑ' relative to the surface normal 218, the ion beam source 204 generates an ion beam 216 and the ion beam chamber 202 directs the ion beam 216 towards the substrate 210 at the first ion beam angle α. The first actuator 208 positions the platen 206, so that the ion beam 216 contacts the grating material 212 at the second ion beam angle ϑ and etches the grating material 212 to form the structures having a slant angle ϑ' on desired portions of the grating material 212.

Conventionally, to form a portion of structures with a slant angle ϑ' than different than the slant angle ϑ' of an adjacent portion of structures or form structures having a different slant angle ϑ' on successive substrates, the first ion beam angle α is changed, the tilt angle β is changed, and/or multiple angled etch systems are used. Reconfiguring the hardware of the ion beam chamber 202 to change the first ion beam angle α is complex and time-consuming. Adjusting tilt angle β to modify the ion beam angle ϑ results in non-uniform depths of structures across portions of the substrate 210 as the ion beam 216 contacts the grating material 212 with different energy levels. For example, a portion positioned closer to the ion beam chamber 202 will have structures with a greater depth than structures of an adjacent portion positioned further away from the ion beam chamber 202. Using multiple angled etch systems increases the fabrication time and increases costs due the need of multiple chambers. To avoid reconfiguring the ion beam chamber 202, adjusting the tilt angle β to modify the ion beam angle ϑ, and using multiple angled etch systems, the angled etch system 200 includes a second actuator 220 coupled to the platen 206 to rotate the substrate 210 about the x-axis of the platen 206 to control the slant angle ϑ of structures.

Figure 3:
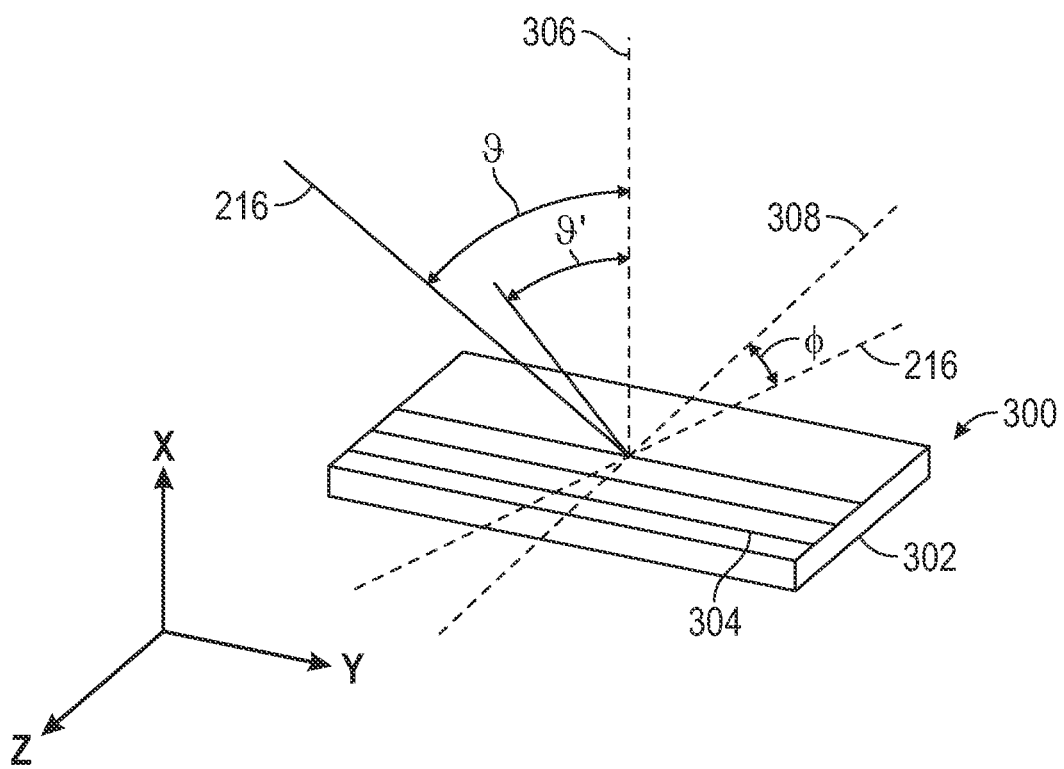
FIG. 3 is a schematic perspective view of a portion of a substrate, according to one embodiment.
Figure 4:
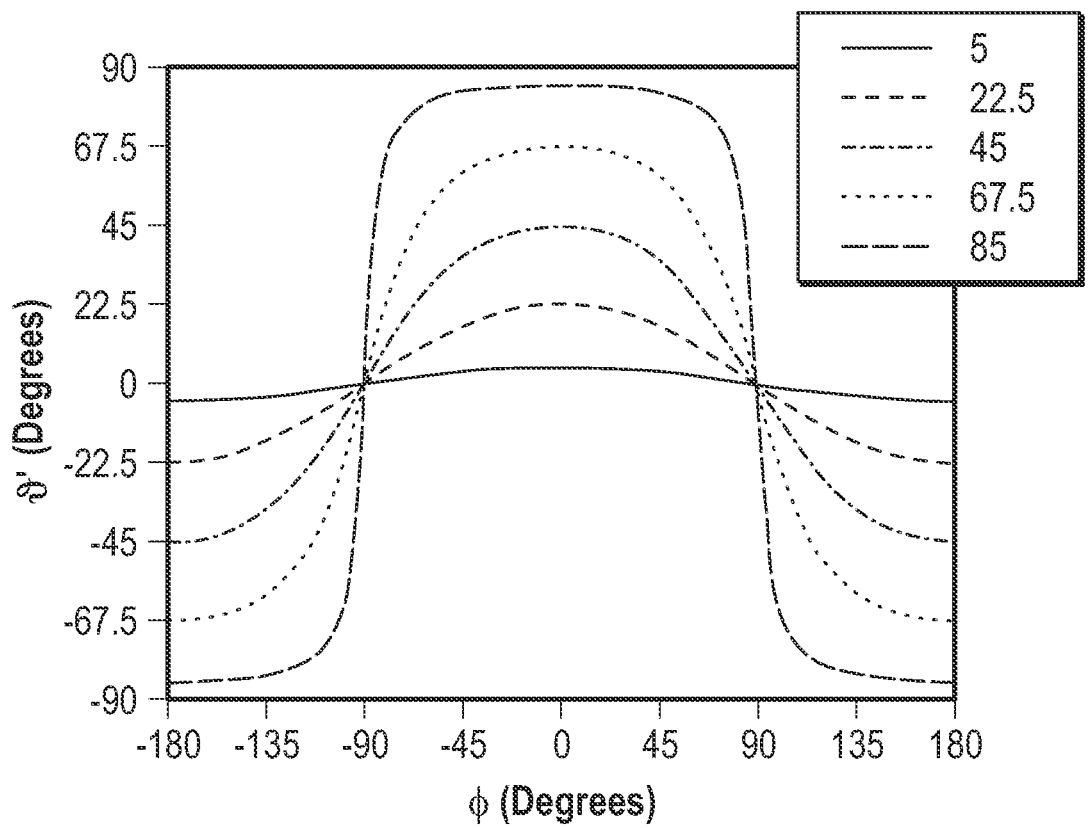
FIG. 4 is a graph of the results of the equivalent slant angle $\vartheta'$ equations, according to one embodiment.

FIG. 3 is a schematic perspective view of a portion 300 of a substrate 302, according to one embodiment. The tilt angle β and first ion beam angle α of the ion beam 216 are fixed such that the ion beam angle ϑ relative to the surface normal 306 of the substrate 302 is constant across the substrate 302. The first ion beam angle α is between about 0° and about 90° and the tilt angle β is between about 0° and about 30°. The resulting second ion beam angle ϑ is between about 0° and about 90°. The second ion beam angle ϑ is preferably between about 25° and about 75° as an ion beam angle ϑ close to about 0° or close to about 90° will result in structures 304 having a slant angle ϑ' of about 0° or about 90° such that the structures 304 are not slanted. The substrate 302 is rotated about the x-axis of the platen 206 resulting in a rotation angle φ between the ion beam 216 and a grating vector 308 of the structures 304. The rotation angle φ is selected to control the slant angle ϑ' without reconfiguring the ion beam chamber 202, without adjusting the tilt angle β to modify the ion beam angle ϑ, and without using multiple angled etch systems. To determine the resulting slant angle ϑ' with the second ion beam angle ϑ the following equivalent slant angle ϑ' equations are implemented: $\sin(\vartheta')=\sin(\vartheta)/\sqrt{1+\tan^2(\varphi)*\cos^2(\vartheta)}$ and $\tan(\vartheta')=\tan(\vartheta)*\cos(\varphi)$. Solving for φ, the rotation angle φ is $\cos^{-1}(\tan(\vartheta')/\tan(\vartheta))$. For example, if the ion beam angle ϑ is 45° and the desired slant angle ϑ' is 22.5°, the rotation angle φ is about 65.53° as $\cos^{-1}(\tan(22.5)/\tan(45))=65.53$. FIG. 4 is a graph of the results of the equivalent slant angle ϑ' equations for ion beam angles ϑ of 5°, 22.5°, 45°, 67.5°, and 85° as a function of rotation angle φ.

The grating vector 308 can also be more generally referred to a first vector. As described above, this disclosure is not limited to applications relating to forming optical devices, such as optical device 205, and thus the use of the term first vector more generally refers to a vector that is perpendicular to a direction in which the first plurality of structures extend across the plane in which the material to be etched (e.g., grating material 212) is disposed. For example, the grating material (also referred to as first material) is disposed across the YZ plane (also referred to as the first plane), and the grating vector 308 (also referred to as first vector) is perpendicular to the direction in which the structures 304 extend in the YZ plane. Referring to FIGS. 2A and 3, the structures 304 are spaced apart in a direction substantially close to the Z-direction and the structures extend in a direction substantially close to the Y-direction.

In one embodiment, structures 304 having a slant angle ϑ' can be formed with the angled etch system 200 shown in FIGS. 2A, 2B above. In another embodiment, structures 304 having a slant angle ϑ' can be formed with an ion beam etch system, also known as full wafer, immersive, or gridded etch system, having an ion beam source 204 housed in a ion beam chamber 202 that generates an ion beam 216 having a geometry corresponding to the geometry of the surface of the substrate 302 at a first ion beam angle α of about 0°. The platen 206 of the ion beam etch system is configured to position the substrate 210 at a tilt angle β so that the ion beam 216 contacts the substrate 302 at an ion beam angle ϑ between about 25° and about 75°. The rotation angle φ is selected to control the slant angle ϑ' as described herein.

Figure 5:
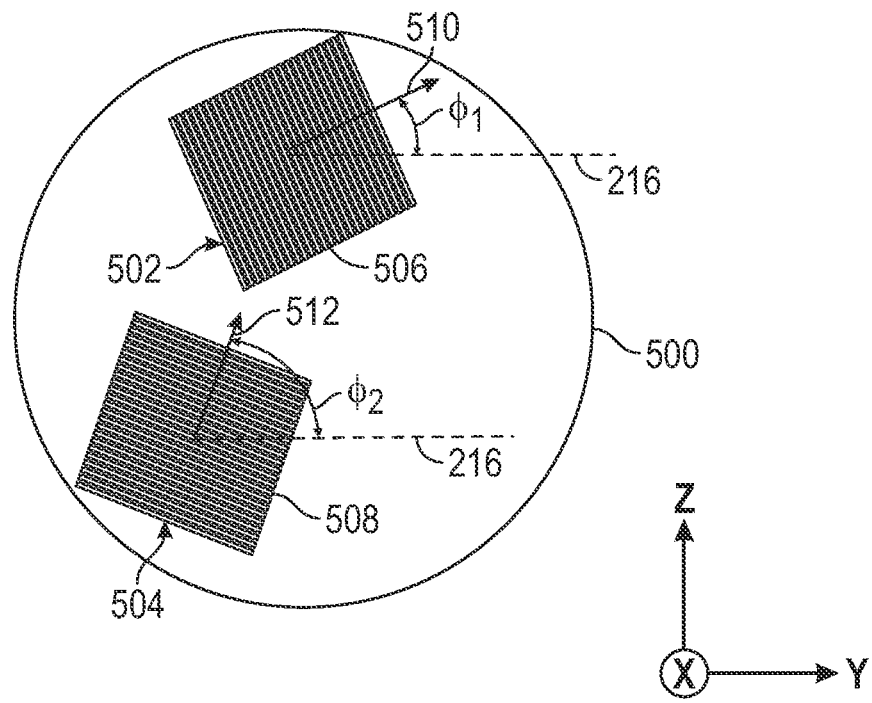
FIG. 5 is a schematic top view of a substrate having a first portion of structures and a second portion of structures, according to one embodiment.

FIG. 5 is a schematic top view of a substrate 500 having a first portion 502 of structures 506 and a second portion 504 of structures 508, according to one embodiment. In one embodiment, the portions 502, 504 can be a first grating 502 and a second grating 504, and the structures 506, 508 can be corresponding fins 506, 508 of the respective gratings 502, 504. The structures 506, 508 can be formed using the angled etch system 200 shown above in FIGS. 2A, 2B. FIG. 5 is described in reference to the angled etch system 200 shown above in FIGS. 2A, 2B as well as FIG. 5. The tilt angle β and first ion beam angle α of the ion beam 216 are fixed such that the ion beam angle ϑ relative a surface normal of the substrate 500 is constant when the ion beam 216 is directed at the different portions 502, 504. The first ion beam angle α is between about 0° and about 90° and the tilt angle β is between about 0° and about 30°. The resulting second ion beam angle ϑ is between about 0° and about 90°. The second ion beam angle ϑ is preferably between about 25° and about 75° as an ion beam angle ϑ close to about 0° or close to about 90° will result in the structures having a slant angle of about 0° or about 90° such that the structures 506, 508 would not be slanted.

To form the structures 506, 508 of the respective portions 502, 504, the substrate 500 can be rotated about the x-axis of the platen 206 resulting in a rotation angle $\phi_1$ between the ion beam 216 and a grating vector 510 of the structures 506 for forming the structures 506 and a rotation angle $\phi_2$ between the ion beam 216 and a grating vector 512 of the structures 508 for forming the structures 508. The pattern of the hardmask in a particular area can be used to determine the grating vector for that area because the pattern of the hardmask determines the directions at which structures extend across a substrate after an etch is performed. For example, the grating vector 510 (also referred to as first vector) is substantially perpendicular to the direction across which the structures 506 extend in the YZ plane (also referred to as first plane). Similarly, the grating vector 512 (also referred to as second vector) is substantially perpendicular to the direction across which the structures 508 extend in the YZ plane (also referred to as first plane).

The rotation angle $\phi_1$ is selected to form structures 506 having a slant angle $\vartheta'_1$ and the rotation angle $\phi_2$ is selected to form structures 508 having a slant angle $\vartheta'_2$ by moving the platen 206 in the scanning motion with a single pass traversing the ion beam chamber 202 such that the first portion 502 and second portion 504 are positioned in the path of the ion beam 216. To form two or more portions of structures (e.g., structures 506, 508) with a single pass of the platen 206 traversing the ion beam chamber 202, the following system of equations is implemented:

$$\vartheta = \arctan(\tan(\vartheta'_1)/\cos(\phi_1)) =$$

$$\vartheta = \arctan(\tan(\vartheta'_2)/\cos(\phi_2))$$

$$\Delta\phi = \phi_2 - \phi_1$$

In one embodiment, the slant angle $\vartheta'_1$, the slant angle $\vartheta'_2$, and the $\Delta\phi$ are known. Solving the system of equations for the rotation angle $\phi_1$, the rotation angle $\phi_2$, and ion beam angle $\vartheta$ will allow for the formation of the structures 506 having the slant angle $\vartheta'_1$ and the structures 508 having the slant angle $\vartheta'_2$ with a single pass of the platen 206 traversing the ion beam chamber 202.

Figure 6:
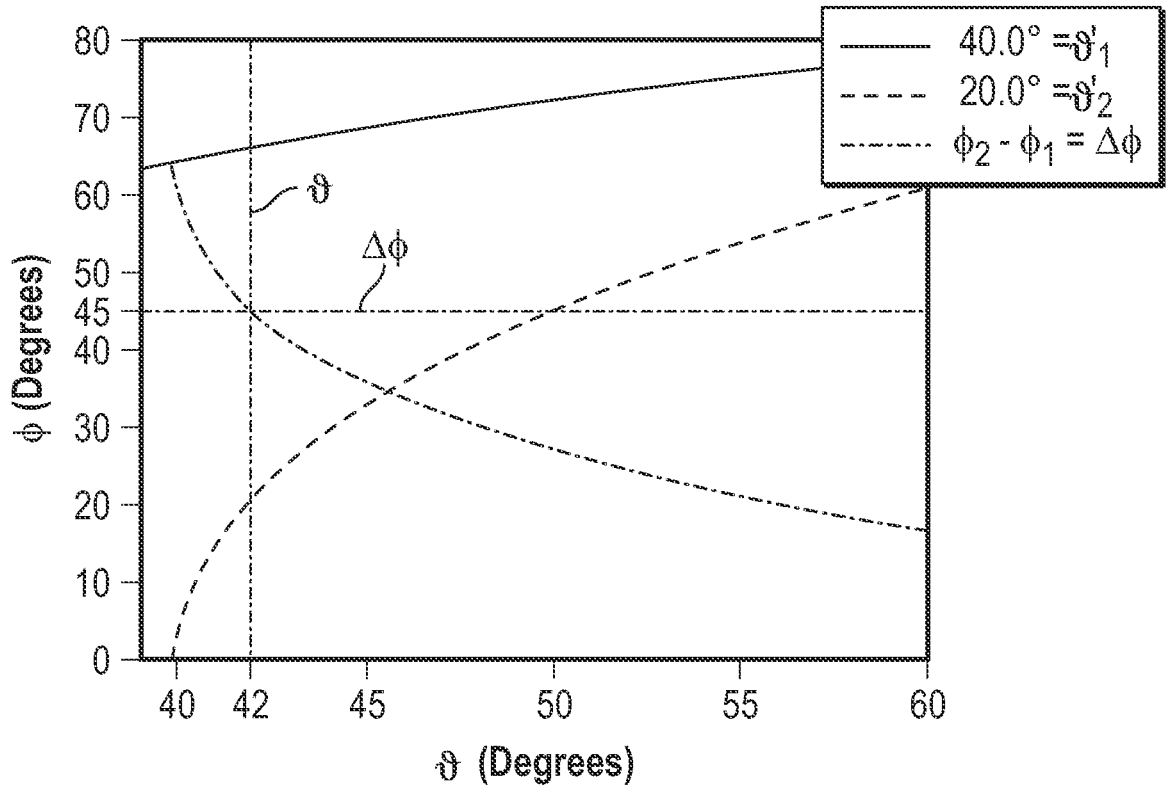
FIG. 6 is a graph of the results of the system of equations for the rotation angle $\phi_1$, the rotation angle $\phi_2$, and the ion beam angle $\vartheta$, according to one embodiment.

FIG. 6 is a graph of the results of the system of equations for the rotation angle $\phi_1$, the rotation angle $\phi_2$, and the ion beam angle $\vartheta$. To form structures 506 having a slant angle $\vartheta'_1$ of 40° and structures 508 having a slant angle $\vartheta'_2$ of 20° with a $\Delta\phi$ of 45°, a rotation angle $\phi_1$ of 21.1° and a rotation angle $\phi_2$ of 66.1° will form the first portion 502 and second portion 504 with a single pass of the platen 206 traversing the ion beam chamber 202. Thus, the structures 506 having the slant angle $\vartheta'_1$ and the structures 508 having the slant angle $\vartheta'_2$ are formed with a single pass of the platen 206 traversing the ion beam chamber 202 without reconfiguring the ion beam chamber 202, without adjusting the tilt angle $\beta$ to modify the ion beam angle $\vartheta$, and without using multiple angled etch systems. Additionally, the system of equations may be extended to form three or more portions of structures (e.g., gratings) having different slant angles $\vartheta'$. In another embodiment, the ion beam angle $\vartheta$, the slant angle $\vartheta'_1$, the slant angle $\vartheta'_2$, and the $\Delta\phi$ are known and the system of equations is solved for the rotation angle $\phi_1$ and the rotation angle $\phi_2$.

Figure 7:
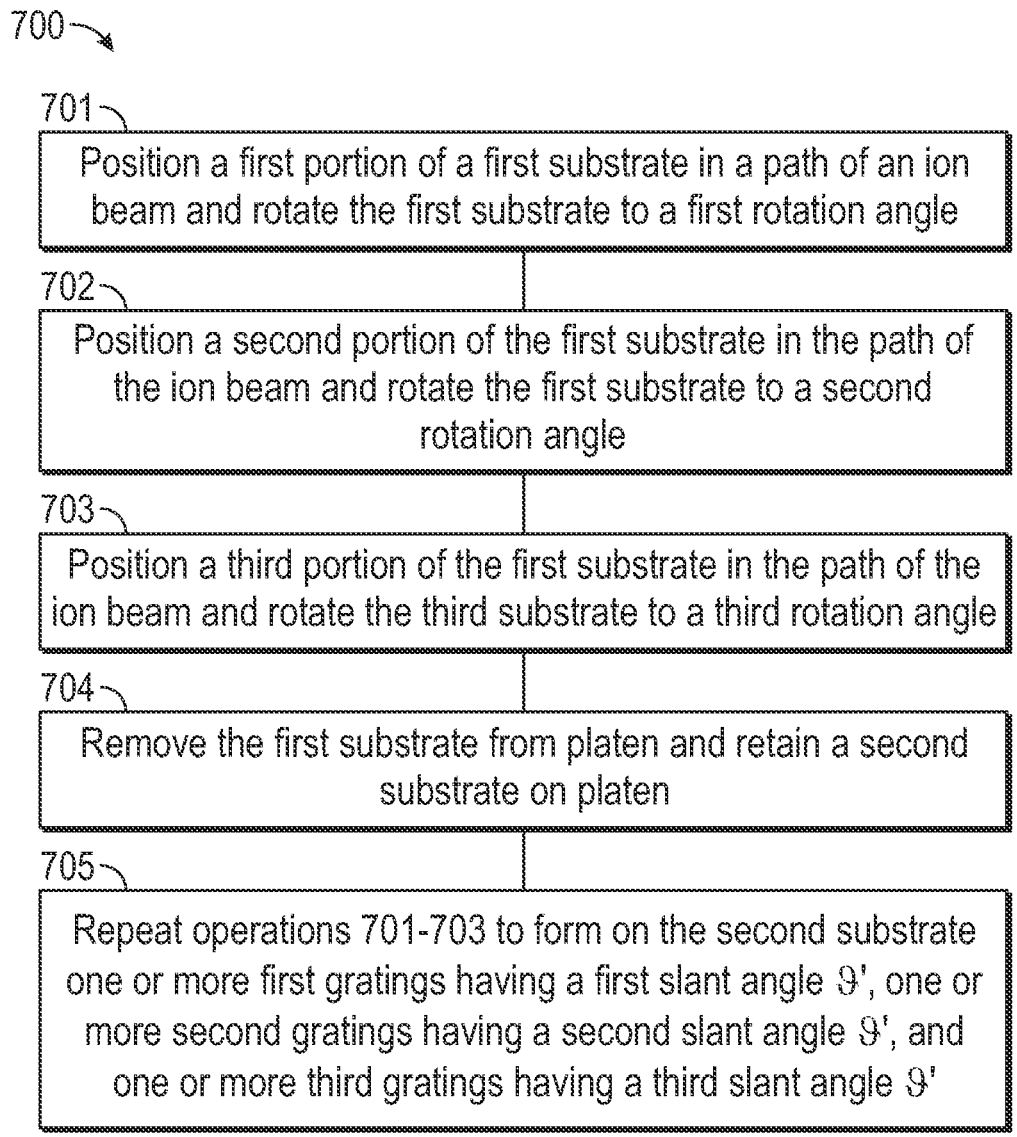
FIG. 7 is a flow diagram of a method for forming structures with different slant angles, according to an embodiment.

FIG. 7 is a flow diagram of a method 700 for forming structures with different slant angles. In one embodiment, the method 700 is performed by the angled etch system 200 shown in FIGS. 2A, 2B above. Referring to FIGS. 2A, 2B, and 7, the method 700 is described. The angled etch system 200 includes the ion beam source 204 that generates the ion beam 216, such as a ribbon beam or a spot beam, housed in the ion beam chamber 202. The ion beam chamber 202 is configured to direct the ion beam 216 at the first ion beam angle $\alpha$ relative to the surface normal 218 of substrate 210. The first actuator 208 coupled to the platen 206 is configured to move the substrate 210 in a scanning motion and tilt the platen 206, such that the substrate 210 is positioned at the tilt angle $\beta$ relative to the axis of the ion beam chamber 202. The first actuator 208 is configured to move the platen 206 in the scanning motion along the y-direction and/or the z-direction. The first ion beam angle $\alpha$ and the tilt angle $\beta$ result in the second ion beam angle $\vartheta$ relative to the surface normal 218.

At operation 701, a first portion of a first substrate having a grating material 212 disposed thereon is positioned in a path of the ion beam 216. The ion beam 216 contacts the grating material 212 at an ion beam angle $\vartheta$ relative to a surface normal 218 of the first substrate and forms one or more first structures in the grating material 212. The first substrate is retained on the platen 206. The platen 206 is configured to position the first portion of the first substrate in the path of the ion beam 216 and to rotate the first substrate about an axis of the platen 206 resulting in a first rotation angle $\phi$ between the ion beam 216 and a grating vector (e.g., grating vector 308) of the one or more first structures. The first rotation angle $\phi$ is selected to result in the one or more first structures having a first slant angle $\vartheta'$ relative to the surface normal 218 of the substrate. The first rotation angle $\phi$ is selected by the rotation angle $\phi$ equation of $\phi = \cos^{-1}(\tan(\vartheta')/\tan(\vartheta))$ as described above. In one embodiment, the first portion can correspond to the input grating 102 of the optical device 100 shown in FIG. 1.

To form one or more second structures on a second portion of the first substrate with a second slant angle $\vartheta'$ different than the first slant angle $\vartheta'$ without reconfiguring the ion beam chamber 202 to change the first ion beam angle $\alpha$, adjusting the tilt angle $\beta$ to modify the ion beam angle $\vartheta$, or using multiple angled etch systems, the first ion beam angle $\alpha$ and tilt angle $\beta$ remain constant while the first substrate is rotated by the second actuator 220 coupled to the platen 206 about the axis of the platen 206.

At operation 702, a second portion of the first substrate having the grating material 212 disposed thereon is positioned in the path of the ion beam 216. The ion beam 216 contacts the grating material 212 at the ion beam angle $\vartheta$ relative to the surface normal 218 of the first substrate and forms one or more second structures in the grating material 212. The second portion is positioned in the path of the ion beam 216 with the first substrate rotated about the axis of the platen 206 resulting in a second rotation angle $\phi$ between the ion beam 216 and a grating vector (e.g., grating vector 308) of the one or more second structures. The second rotation angle $\phi$ is selected to result in the one or more second structures having a second slant angle $\vartheta'$ relative to the surface normal 218 of the substrate. The second rotation angle $\phi$ is selected by the rotation angle $\phi$ equation of $\phi = \cos^{-1}(\tan(\vartheta')/\tan(\vartheta))$. In one embodiment, the second portion can correspond to the intermediate grating 104 of the optical device 100 shown in FIG. 1.

At operation 703, a third portion of the first substrate having the grating material 212 disposed thereon is positioned in the path of the ion beam 216. The ion beam 216 contacts the grating material 212 at the ion beam angle $\vartheta$ relative to the surface normal 218 of the first substrate and forms one or more third structures in the grating material 212. The third portion is positioned in the path of the ion beam 216 with the first substrate rotated about the axis of the platen 206 resulting in a third rotation angle ϕ between the ion beam 216 and a grating vector (e.g., grating vector 308) of the one or more third structures. The third rotation angle ϕ is selected to result in the one or more third structures having a third slant angle ϑ' relative to the surface normal 218 of the substrate. The third rotation angle ϕ is selected by the rotation angle ϕ equation of $\phi=\cos^{-1}(\tan(\vartheta')/\tan(\vartheta))$. In one embodiment, the third portion can correspond to the output grating 106 of the optical device 100 shown in FIG. 1.

At operation 704, the first substrate is removed, and a second substrate is retained on the platen 206. At operation 705, operations 701-703 are repeated to form on a second substrate one or more first structures having a first slant angle ϑ', one or more second structures having a second slant angle ϑ' different than the first slant angle ϑ', and one or more third structures having a third slant angle ϑ' different than the first slant angle ϑ' and the second slant angle ϑ'.

Figure 8:
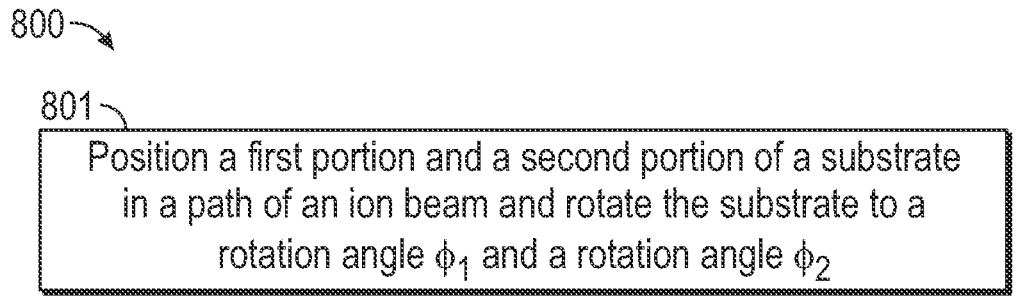
FIG. 8 is a flow diagram of a method for forming portions of structures having different slant angles with a single pass, according to one embodiment.

FIG. 8 is a flow diagram of a method 800 for forming portions of structures having different slant angles, according to one embodiment. In one embodiment, the method 800 is performed by the angled etch system 200 shown in FIGS. 2A, 2B above. Referring to FIGS. 2A, 2B, 5, and 8, the method 800 is described. At operation 801 a first portion 502 and a second portion 504 of a substrate 500 having a grating material 212 disposed thereon are positioned in a path of the ion beam 216 with a single pass of the platen 206 traversing the ion beam chamber 202. The ion beam 216 contacts the grating material 212 at an ion beam angle ϑ relative to a surface normal 218 of the substrate 500 and forms one or more structures 506 and one or more structures 508 in the grating material 212. The substrate 500 is retained on the platen 206 configured to position the first portion 502 and second portion 504 in the path of the ion beam 216 with the substrate 500 rotated about an axis of the platen 206 resulting in a rotation angle ϕ1 between the ion beam 216 and a grating vector 510 of the one or more structures 506 and a rotation angle ϕ₂ between the ion beam 216 and a grating vector 512 of the one or more structures 508. The rotation angle ϕ1 is selected to result in the one or more structures 506 having a slant angle ϑ'₁ relative to the surface normal 218 of the substrate. The rotation angle ϕ₂ is selected to result in the one or more structures 508 having a slant angle ϑ'₂ relative to the surface normal 218 of the substrate. The rotation angle ϕ1 and the rotation angle ϕ₂ are selected by solving the system of equations:

$$\vartheta=\arctan(\tan(\vartheta'_1)/\cos(\phi_1))$$

$$\vartheta=\arctan(\tan(\vartheta'_2)/\cos(\phi_2))$$

$$\Delta\phi=\phi_2-\phi_1$$

In one embodiment, the slant angle ϑ'₁, the slant angle ϑ'₂, and the Δϕ are known. Solving the system of equations for the rotation angle ϕ1, the rotation angle ϕ₂, and ion beam angle ϑ will allow for the formation of the structures 506 having the slant angle ϑ'₁ and the structures 508 the having slant angle ϑ'₂ with a single pass of the platen 206 traversing the ion beam chamber 202. In another embodiment, the ion beam angle ϑ, the slant angle ϑ'₁, the slant angle ϑ'₂, and the Δϕ are known and the system of equations is solved for the rotation angle ϕ₁ and the rotation angle ϕ₂. Thus, the structures 506 having the slant angle ϑ'₁ and the structures 508 the having slant angle ϑ'₂ are formed with a single pass of the platen 206 traversing the ion beam chamber 202 without reconfiguring the ion beam chamber 202, without adjusting the tilt angle β to modify the ion beam angle ϑ, and without using multiple angled etch systems. Additionally, the system of equations may be extended to form three or more portions of gratings. The method 800 may be repeated for subsequent substrates.

Methods of successively forming structures (e.g., fins of a grating) with different slant angles on a single substrate and forming structures (e.g., fins of a grating) with different slant angles on successive substrates using angled etch systems are described above. Selecting the one or more rotation angles ϕ to control the slant angle ϑ' for the structures formed without reconfiguring the ion beam chamber or adjusting the tilt angle β to modify the ion beam angle ϑ, or using multiple angled etch systems allows a singled angled etch system, such as the angled etch system 200 shown in FIGS. 2A, 2B, to fabricate an optical device (e.g., a waveguide combiner) having structures with different slant angles ϑ' as well as different optical devices (e.g., different waveguide combiners) including different structures.

The angled etch system 200 or a similar system can also be used to create structures having features other than the features of the structures shown in FIGS. 2A, 2B, 3. For example, the structures shown in FIG. 2A are formed, so that the areas between the structures across the device (e.g., the YZ plane) have a same depth in the X-direction. In some applications, the depth between the structures in the X-direction can be varied in one or more directions (i.e., in the YZ plane) across the device. Varying the depth between the structures can be used, for example, to control the percentage of light that is coupled through one or more gratings, for example a set of gratings used on a waveguide combiner. Shallower depths between structures in a grating can result in weaker coupling of light through the grating while deeper depths between structures in a grating can result in stronger coupling of light through the grating. Controlling the percentage of light that is coupled through a set of gratings improves control of the image that is ultimately displayed to the user of a waveguide combiner, for example by an augmented reality device.

Creating structures (e.g., fins of gratings) having depths between the structures that vary in one or more dimensions across a device previously required using substantially more complex processes, than the processes described below. The following describes embodiments of processes for forming a device including structures with depths between structures that vary in one dimension (see FIGS. 9A-9C and FIG. 10) as well as a device including structures with depths between the structures that vary in multiple dimensions (see FIGS. 11A-11D and FIG. 12). These devices described below that include structures with variable depths between the structures can be formed by the angled etch system 200 described above, for example, in reference to FIG. 2A.

Figure 9A:
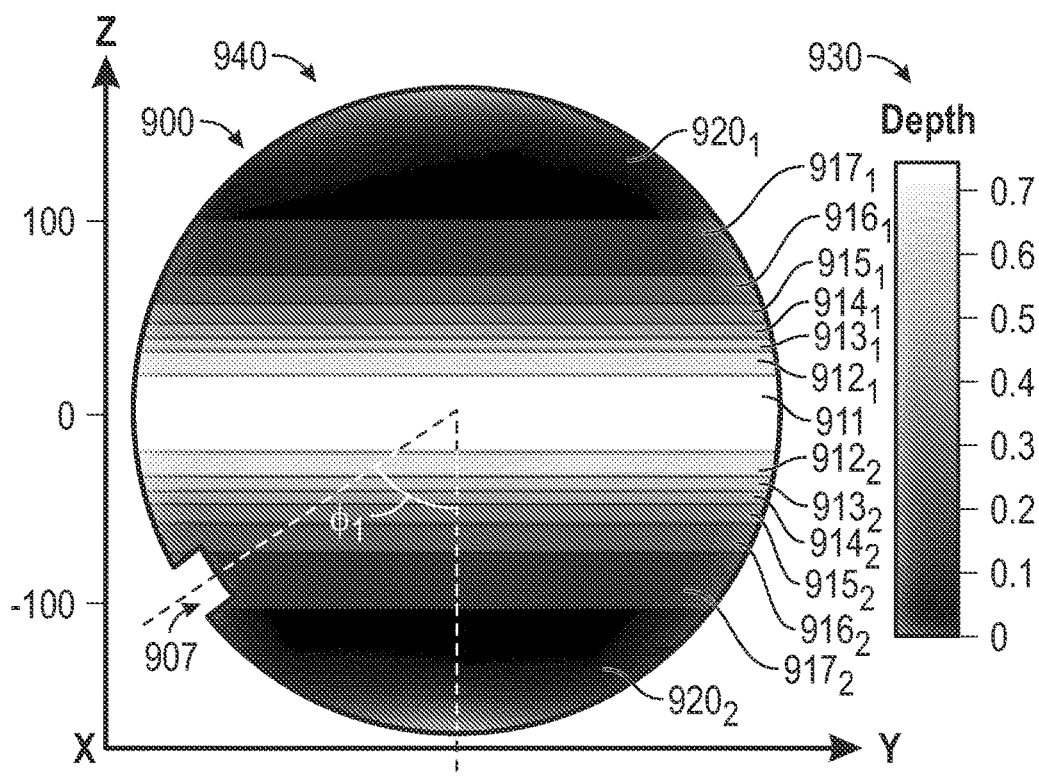
FIG. 9A is a top view of a contour plot of a device including structures with depths between the structures that vary in one dimension, according to one embodiment.

FIG. 9A is a top view of a contour plot 940 of a device 900 including structures with depths between the structures that vary in one dimension, according to one embodiment. A device including structures with depths between the structures that vary in one dimension (e.g., Z in FIG. 9A) means a device in which a single dimension (e.g., Z in FIG. 9A) exists that can be used to describe the direction of depth variation and there is no dimension (e.g., X and Y in FIG. 9A) perpendicular to this single dimension (e.g., Z in FIG. 9A) along which the depth varies.

In FIG. 9A, the device is 900 rotated at a first rotation angle ϕ₁. The device 900 can be formed by the angled etch system 200 described above. The device 900 includes a plurality of structures (e.g., fins of one or more gratings) in which the depth between the structures varies along the Z-direction. The slant angle ϑ' of the structures can be determined in part by the first rotation angle $\phi_1$ as described above and described in further detail below. A depth shading chart 930 indicates how the depth between the structures changes across the device 900 as shown by the contour plot 940. Referring to the depth chart 930, the contour plot 940 shows that the depth between the structures varies from a greatest depth in a first section 911 centered in the Z-direction to decreasing depths in opposing Z-directions in top sections $912_1$-$917_1$ and bottom sections $912_2$-$917_2$. For example, the depth between the structures decreases (i.e., become shallower) with each section from the first section 911 to the top seventh section $917_1$. Similarly, the depth between the structures decreases with each section from the first section 911 to the bottom seventh section $917_2$. Although the contour plot 940 shown in FIG. 9A shows sections with different discrete depths with a constant shade in each section, the depths of the sections can gradually change between adjacent sections and within sections. For example, the depth in the top second section $912_1$ can gradually decrease towards the decreased depth of the top third section $913_1$ and the depth in the top third section $913_1$ can gradually decrease towards the depth of the top fourth section $914_1$, and so on and so forth. In some embodiments, the ion beam 216 can translate in the Z-direction to generate the depth variation between the structures shown in FIG. 9A. In other embodiments, the device 900 can translate in the Z-direction to expose the different sections of the device 900 to the ion beam 216.

The device 900 further includes two sections $920_1$, $920_2$ in which material is not removed. In some embodiments, the sections $920_1$, $920_2$ are not exposed to the ion beam 216 of the angled etch system 200. In other embodiments, the sections $920_1$, $920_2$ can be covered by a hardmask or other material that is not significantly affected by the ion beam 216. Other embodiments can more or fewer sections which are not modified by the ion beam 216.

Figure 9B:
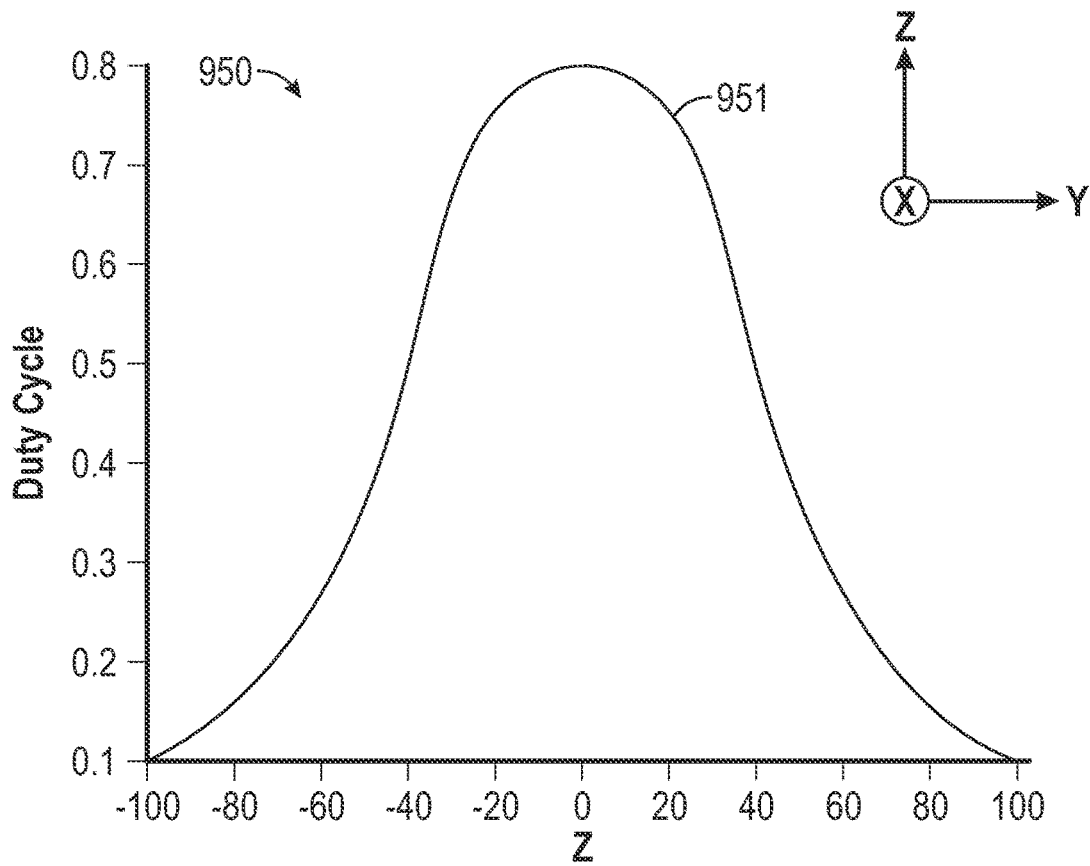
FIG. 9B shows a plot of how a duty cycle of the ion beam can be varied in the Z-direction according to a duty cycle profile across the device to create the depth variation shown in contour plot in FIG. 9A, according to one embodiment.

FIG. 9B shows a plot 950 of how a duty cycle of the ion beam 216 can be varied in the Z-direction according to a duty cycle profile 951 across the device 900 to create the depth variation shown in contour plot 940 in FIG. 9A, according to one embodiment. For example, the duty cycle profile 951 shows how the duty cycle of the ion beam 216 can be gradually increased from a low duty cycle of about 0.1 at a −100 Z-position to a high duty cycle of about 0.8 for a peak at a zero Z-position and then gradually decreased to a low duty cycle of about 0.1 at a +100 Z-position. Although the duty cycle profile 951 shows the duty cycle as being modified similarly to a Gaussian distribution, other methods can be used to vary the duty cycle across the device 900 to generate different depth profiles across the device. Furthermore, other methods can be used to modify the depth across the device 900. For example, in other embodiments a time in which the ion beam 216 is focused on different portions of the device 900 can be varied in the Z-direction while using a constant duty cycle. In still other embodiments, power (e.g., voltage and/or current) applied to generate the ion beam 216 can be varied in the Z-direction to generate the depth variation shown in FIG. 9A in the Z-direction.

Figure 9C:
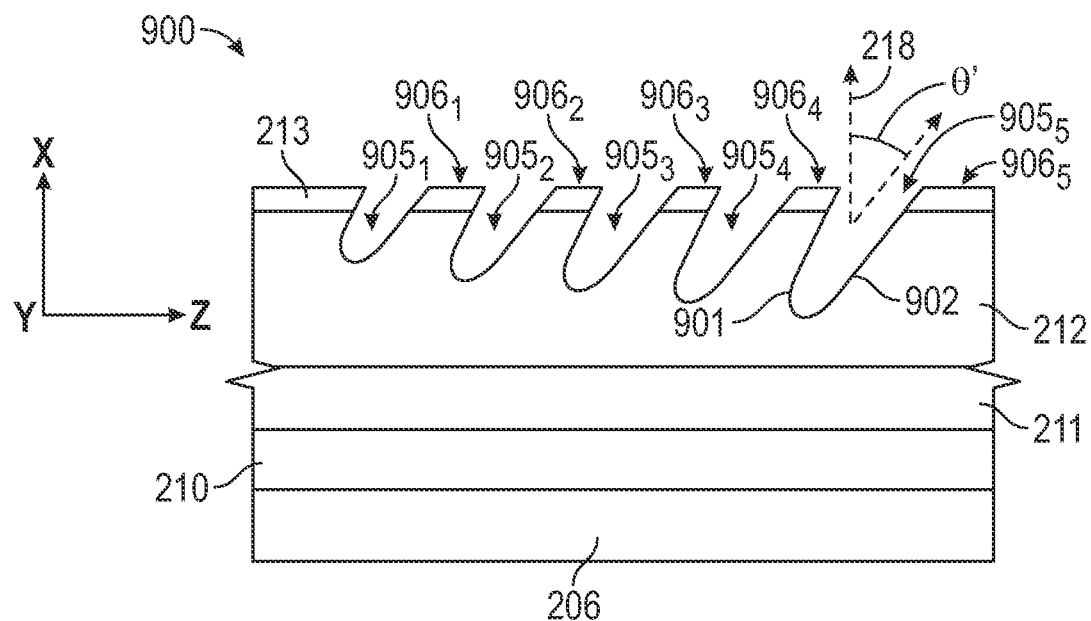
FIG. 9C is a partial side sectional view of the device shown in FIG. 9A, according to one embodiment.

FIG. 9C is a partial side sectional view of the device 900 shown in FIG. 9A, according to one embodiment. The device 900 is similar to the device 205 shown in FIGS. 2A, 2B except that the device 900 includes different structures than the device 205 described above. The device 900 includes the substrate 210, the etch stop layer 211, the grating material 212, and the hardmask 213. The substrate is disposed on the platen 206. Trenches 905 are formed in the grating material 212, which is disposed over the substrate 210. Structures 906 (e.g., fins) are disposed between the trenches 905. The etch stop layer 211 is disposed between the grating material 212 and the substrate 210. The hardmask 213 is disposed over the grating material 212.

In the device 900, the trenches 905 (i.e., the areas between the structures 906) have a depth that varies in the Z-direction. For example, as shown the depth of the trenches 905 and corresponding height of the structures 906 increase in the Z-direction from left to right on the page. For example a second trench $905_2$ has a greater depth than a first trench $905_1$, and a second structure $906_2$ has a greater height than the first structure $906_1$. In some embodiments, a depth of the trenches 905 and height of the structures 906 can vary for each grating in the Z-direction. For example, as shown the depth of the trenches 905 gradually increases for each trench 905 from the first trench $905_1$ to the fifth trench $905_5$. Similarly, the height of the structures 906 gradually increases for each structure 906 from the first structure $906_1$ to the fifth structure $906_5$. The increasing depth of the different trenches 905 and height of the structures 906 in the Z-direction can be caused by increasing the duty cycle of the ion beam 216 as different portions of the grating material 212 are exposed to the ion beam 216 in the Z-direction.

The trenches 905 are each aligned at a slant angle ϑ'. In some embodiments, the trenches 905 are each formed by a first surface 901 and an opposing second surface 902 of adjacent structures 906 that are aligned with the slant angle ϑ'. In other embodiments, the trenches 905 are each formed by a first surface 901 and an opposing second surface 902 of adjacent structures 906 that are substantially aligned with the slant angle ϑ', such as within about 5 degrees of the slant angle ϑ' or within about 1 degree of the slant angle ϑ'. In embodiments in which the angle of the surfaces 901, 902 differ from each other, the slant angle ϑ' can be the average between the angles of the surfaces 901, 902. The slant angle ϑ' can have values from about 0° to about 90°, such as from about 15° to about 75°. In embodiments in which the structures are aligned or substantially aligned according to a slant angle ϑ', the structures can be described as being formed to have the slant angle ϑ'.

The slant angle ϑ' of the trenches 905 and corresponding structures 906 can be formed by directing the ion beam 216 of the angled etch system 200 (FIG. 2A) at the second ion beam angle ϑ with the substrate 210 disposed in a position in which the device 900 is rotated about the axis of the device 900 (i.e., an axis extending through a center of the device 900 in the X-direction) to the rotation angle $\phi_1$ (FIG. 9A). The rotation angle $\phi_1$ at which the device 900 is positioned in FIG. 9A can be selected by the equation $\phi_1 = \cos^{-1}(\tan(\vartheta')/\tan(\vartheta))$ (hereafter referred to as the "Rotation Angle Equation"). As described above in reference to FIG. 2A, the second ion beam angle ϑ is based on the first ion beam angle α relative to a surface normal 218 of the substrate 210 and the tilt angle β relative to the x-axis of the ion beam chamber 202. Adjusting the first ion beam angle α and/or the tilt angle β can cause problems as described above, so adjustment of these angles can be avoided when generating structures (e.g., structures 906) having different slant angles by instead adjusting the rotation angle (e.g., the rotation angle $\phi_1$). Thus, the rotation angle $\phi_1$ to be used for generating structures having a given slant angle ϑ' can be solved for by entering in the values for the second ion beam angle ϑ and the desired slant angle ϑ' into the Rotation Angle Equation.

The rotation angle $\phi_1$ is an angle between the ion beam 216 (see FIG. 2A) and a grating vector, such as the grating vector 308 of the structures 304 shown in FIG. 3. The grating vector can be perpendicular to the direction in which the structures extend, for example in the YZ plane of FIG. 3. For example, the grating vector 308 from FIG. 3A is perpendicular to the direction in which the structures 304 extend in the YZ plane. The grating vector can also be in the same plane as the direction in which the structures extend. For example, the grating vector 308 is in the same plane (i.e., a plane parallel to the top surface of the substrate) as the direction in which the structures 304 extend. Thus, the rotation angle $\phi_1$ determined from a given second ion beam angle $\vartheta$ and a desired slant angle $\vartheta'$ determines how to rotate the substrate relative to the grating vector of the gratings or other structures to be formed by the ion beam 216. The pattern of the hardmask can be used to determine the grating vector for a given portion of a substrate before an etch is performed to form structures, such as structures 906.

In some embodiments, the grating vector can be aligned with the notch 907 (see FIG. 9A). In these embodiments, the substrate can be rotated by the rotation angle $\phi_1$ relative to the notch 907. In other embodiments, the grating vector is offset from the notch 907. In these embodiments, this offset is taken into account with the rotation angle determined from the Rotation Angle Equation to determine how far to rotate the substrate to form the structures with the desired slant angle $\vartheta'$.

Figure 10:
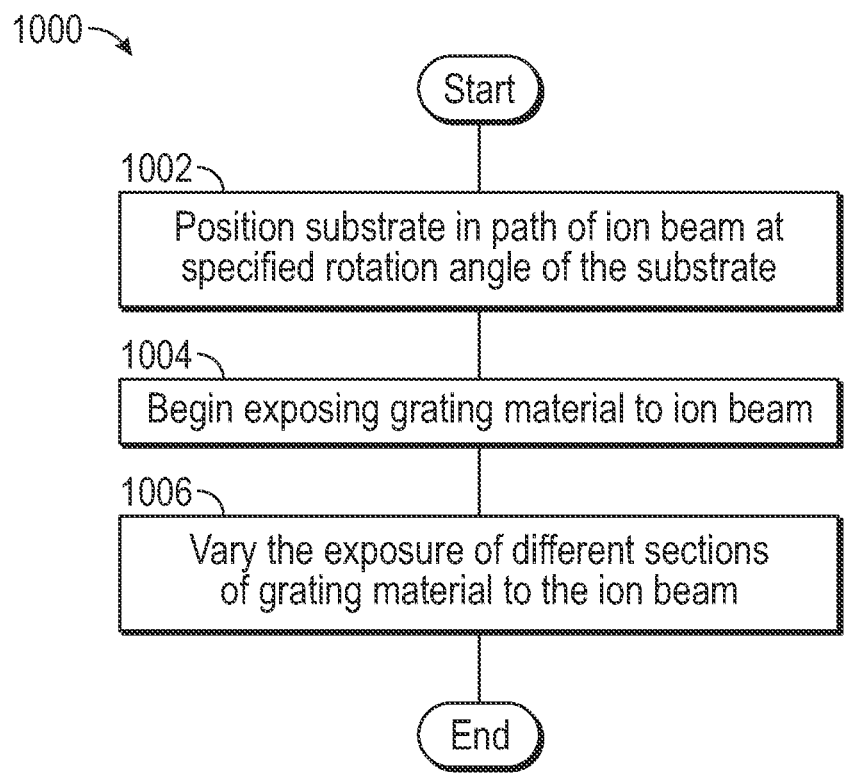
FIG. 10 is a process flow diagram of a method for forming the structures shown in FIGS. 9A-9C, according to one embodiment.

FIG. 10 is a process flow diagram of a method 1000 for forming the trenches 905 and structures 906 (first plurality of structures) shown in FIGS. 9A-9C, according to one embodiment. The method 1000 is described in reference to FIGS. 2A, 3, 9A-9C, and 10.

At block 1002, the device 900 is positioned in the path of the ion beam 216 on and/or against the platen 206 at the rotation angle $\phi_1$. As described above in reference to FIGS. 9A-9C, the rotation angle $\phi_1$ can be determined from the Rotation Angle Equation. In some embodiments, the notch 907 or another feature can be used to align the device 900 to be positioned at the rotation angle $\phi_1$.

At block 1004, the ion beam 216 is applied to expose the grating material 212 (first material) disposed across the YZ plane (first plane) to the ion beam 216 at the second ion beam angle $\vartheta$ relative to the surface normal 218 of the substrate 210 to form the trenches 905 in the grating material 212 and the corresponding structures 906 when the substrate 210 is positioned at the rotation angle $\phi_1$ between the ion beam 216 and the grating vector (e.g., grating vector 308) (also referred as first vector). The grating vector (e.g., grating vector 308) (first vector) is perpendicular to a direction in which the first plurality of structures extend across the YZ plane (first plane). The trenches 905 and structures 906 are formed to have the slant angle $\vartheta'$ relative to the surface normal 218 of the substrate 210. In one embodiment, the ion beam 216 can be initially directed at the bottom seventh section $917_2$, for example aligned with the −100 Z-position as shown in FIG. 9A.

At block 1006, the ion beam 216 can be directed incrementally at different portions of the device 900. For example, the ion beam 216 can be incrementally exposed to the grating material 212 (first material) of the bottom sections $917_2$-$912_2$ of the device 900, followed by the center first section 911, and then followed by the top sections $912_1$-$917_1$. The duty cycle of the ion beam 216 can be varied as shown in the duty cycle profile 951 of FIG. 9B to create the structures 906 and trenches 905 between the structures 906 having depths that vary according to the contour plot 940 shown in FIG. 9A. In some embodiments, the ion beam 216 can be scanned in the Z-direction with a varying duty cycle according to the duty cycle profile 951 across the device 900, which can be disposed on a stationary platen 206. In other embodiments, the device 900 can be translated in the Z-direction to expose the different sections to the ion beam 216.

As mentioned above, although the contour plot 940 shown in FIG. 9A shows sections (e.g., 911 and $912_1$) with different discrete depths, the depths between the structures 906 in the sections can gradually change between adjacent sections and within the sections as the duty cycle gradually changes as shown in the duty cycle profile 951 in FIG. 9B. Also as mentioned above, varying the duty cycle of the ion beam 216 is only one method of varying the depth of the trenches 905 between the structures 906 in the Z-direction. For example, in other embodiments a time in which the ion beam 216 is focused on different sections of the device 900 can be varied in the Z-direction while using a constant duty cycle to form the structures having depths between the structures that vary in the Z-direction. In still other embodiments, power (e.g., voltage and/or current) applied to generate the ion beam 216 can be varied in the Z-direction to generate the depth variation shown in FIG. 9A in the Z-direction.

After block 1006, the method 1000 can be repeated to process additional substrates having the same structures or different structures, such as structures having a different slant angle and/or trenches between the structures having a different depth variation profile. To process another substrate to have structures formed at a different slant angle, a new rotation angle ($\phi_2$) can be determined from the Rotation Angle Equation based on the new slant angle ($\vartheta_2'$), and the method 1000 can be repeated using the newly determined rotation angle ($\phi_2$) to position the new substrate at block 1002. For example, the first substrate can be removed from the substrate support, and the second substrate can be positioned on the substrate support. The second substrate can have grating material (also referred to as second material) disposed across the YZ-plane (also referred to as second plane) when the second substrate is positioned on the substrate support. The second substrate can be positioned at a second rotation angle $\phi_2$ between the ion beam and a grating vector (second vector) of the second plurality of structures to be formed on the second substrate by the ion beam 216. The second vector is perpendicular to a direction in which the second plurality of structures to be formed extend across the second plane. Then, the grating material (second material) on the second substrate can be exposed to the ion beam as blocks 1004 and 1006 described above are repeated.

To process another substrate to have structures formed at the same slant angle but a different depth profile for the trenches between the structures, the duty cycle or other process parameter (e.g., time of exposure, power applied to generate the ion beam 216) can be modified at blocks 1004 and 1006 to generate the specified depth profile while the substrate can be placed in the same position at the rotation angle $\phi_1$ as described above in reference to block 1002 and shown in FIG. 9A. Furthermore, a modified version of block 1002 can be combined with a modified version of blocks 1004, 1006 to process another substrate and generate a device having structures with a different slant angle and trenches between the structures with a different depth profile compared to the structures and trenches formed on the first substrate with the initial execution of blocks 1002-1006.

The method 1000 can also be performed and repeated on isolated areas of a single substrate to form different structures having different slant angles and different depth profiles on the single substrate. For example, referring to FIGS. 7 and 10, the method 1000 can be executed at operation 701, again at operation 702, and again at operations 703. Operations 701-703 are described above as being used to generate structures at different slant angles. Thus, executing the method 1000 on isolated areas of a single substrate at each of operations 701-703, can be used to form (1) at block 701, a first plurality of structures extending at a first slant angle $\vartheta_1'$ in which the depth between the first plurality of structures varies according to a first depth profile, (2) at block 702, a second plurality of structures extending at a second slant angle $\vartheta_2'$ in which the depth between the second plurality of structures varies according to a second depth profile, and (3) at block 703, a third plurality of structures extending at a third slant angle $\vartheta_3'$ in which the depth between the third plurality of structures varies according to a third depth profile.

In some embodiments, a device having structures with depths between the structures that vary in multiple dimensions can be formed. A device having structures with depths between the structures that vary in multiple dimensions can enhance control over the light coupled through the device, for example where the structures are used to form one or more gratings of a waveguide combiner. This enhanced control of the light coupling through a device (e.g., a waveguide combiner) can further improve the quality of images output from a waveguide combiner, for example to a user of an augmented reality device including the waveguide combiner. FIGS. 11A-11D and 12 describe one embodiment of a device and related method in which the device formed includes structures with trenches between the structures having a depth profile that varies in multiple dimensions.

Figure 11A:
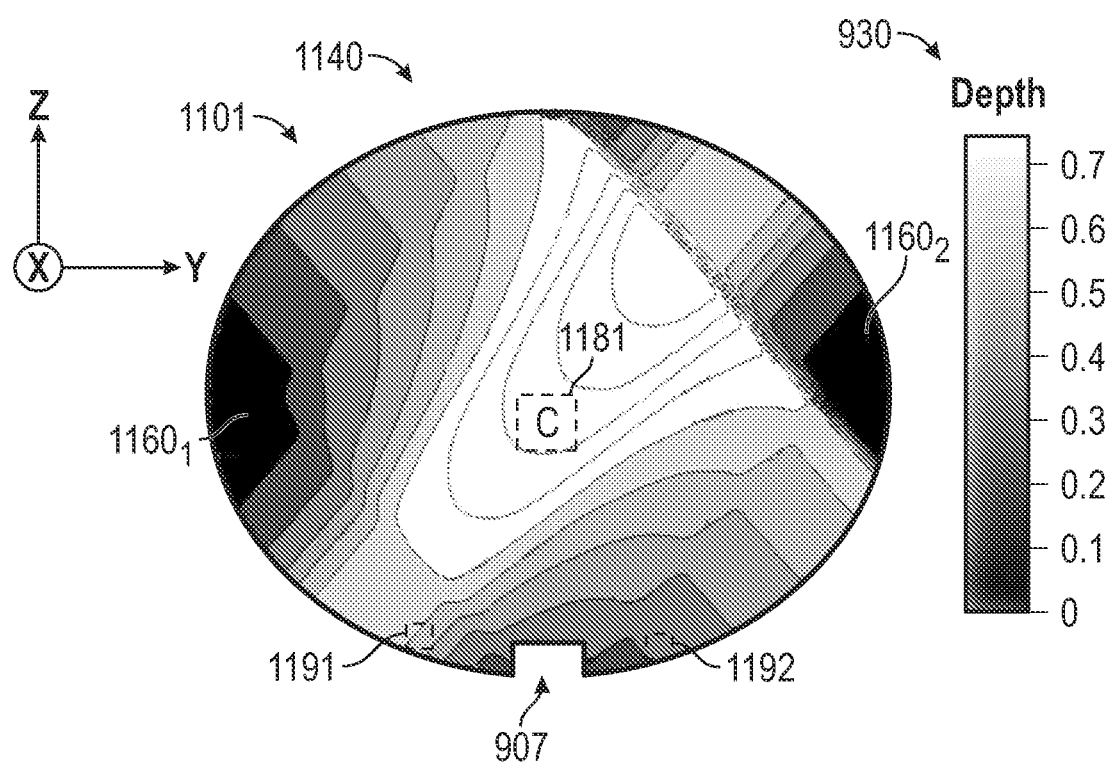
FIG. 11A is a top view of a contour plot of a device including structures with depths between the structures that vary in multiple dimensions, according to one embodiment.

FIG. 11A is a top view of a contour plot 1140 of a device 1101 including structures (e.g., fins of one or more gratings) with depths between the structures that vary in multiple dimensions, according to one embodiment. The device 1101 can extend across the YZ plane and include trenches between the structures having a depth in the X-direction where the depth of the trenches vary across the Y-direction and the Z-direction. The depth of the trenches between the structures at different locations on the device 1101 can be determined with reference to the depth chart 930, which shows the how the relative depths of the trenches between the structures change on the contour plot 1140 of the device 1101.

Used herein, a device including structures with depths between the structures that vary in multiple dimensions means a device in which there does not exist a single dimension that can be used to describe the direction of depth variation for which there is no dimension perpendicular to this single dimension along which the depth varies. For example, referring to FIG. 11A, there is no dimension along which the depth varies for which there is not also a perpendicular dimension along which the depth also varies. Furthermore, at least in some embodiments, a device including structures with depths between the structures that vary in multiple dimensions can mean a device which includes a center point C in which the depth varies in directions encompassing 360 degrees around the center point C, such as shown in FIG. 11A.

Although not separately shown and not required, the structures of the device 1101 can have a similar shape (e.g., same slant angle $\vartheta'$) to the structures 906 described above in reference to FIG. 9C. Further, other features of the device 1101 can be the same as the corresponding features in the device 900 described above. For example, referring to FIG. 9C, the device 1101 can also include the grating material 212 disposed over the substrate 210 with the etch stop layer 211 disposed between the substrate 210 and the grating material 212, and the hardmask layer 213 disposed over the grating material 212. The device 1101 can be formed by the angled etch system 200 describe above in reference to FIG. 2A.

Figure 11B:
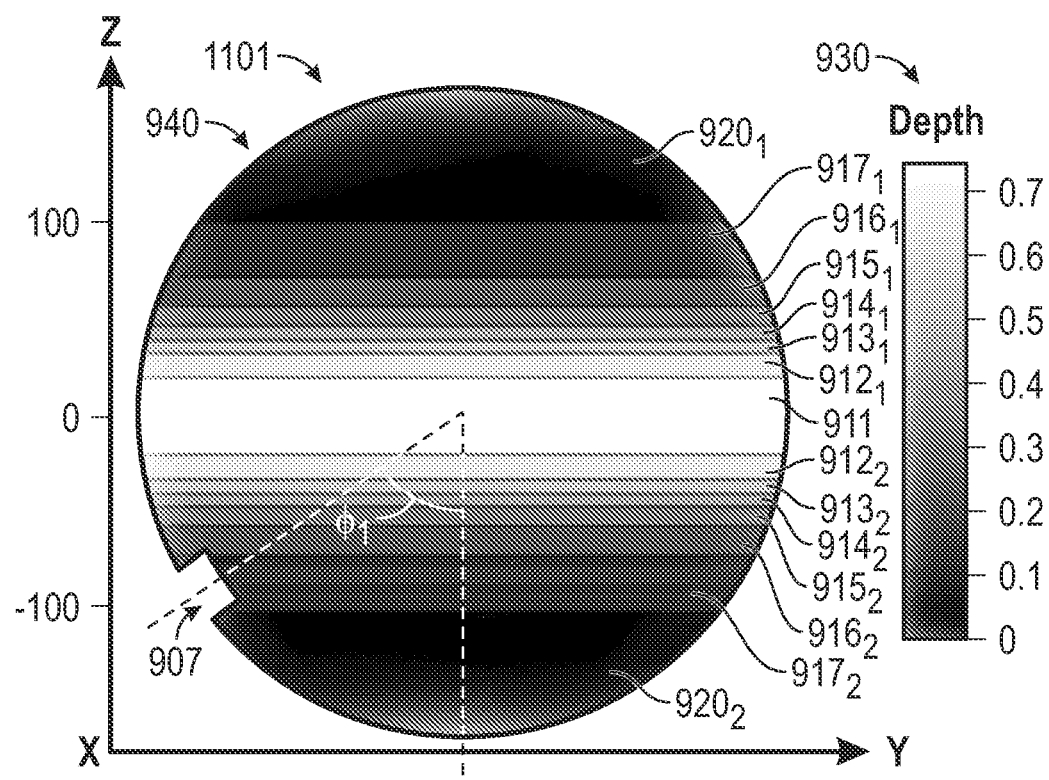
FIG. 11B is a top view of a contour plot of the device showing a variation in depth between the structures caused by exposing the first material of the device to the ion beam when the device is positioned at the first rotation angle, according to one embodiment.
Figure 11C:
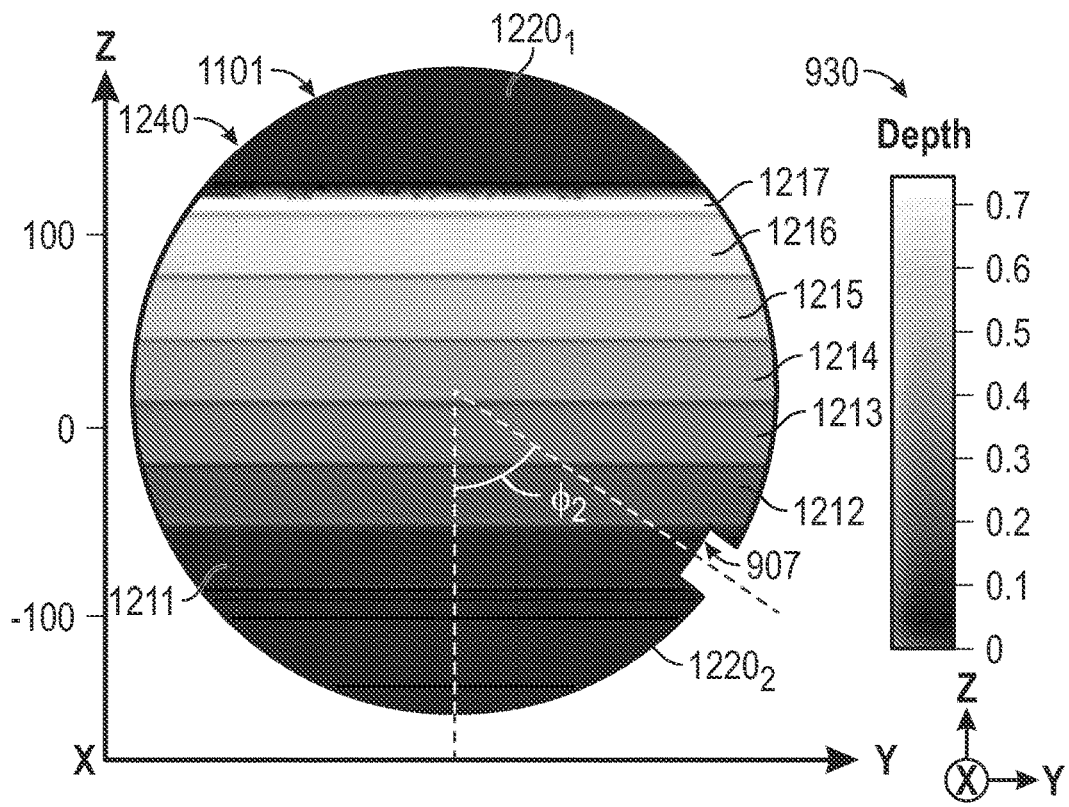
FIG. 11C is a top view of a contour plot of the device showing a variation in depth between the structures caused by exposing the first material of the device to the ion beam when the device is positioned at a second rotation angle, according to one embodiment.

The device 1101 can be formed to have structures with depths between the structures that vary in multiple directions by (1) exposing the grating material 212 of the device 1101 to the ion beam 216 (FIG. 2A) at a first rotation angle $\phi_1$ (FIG. 11B) and then (2) exposing the grating material 212 of the device 1101 to the ion beam 216 at a second rotation angle $\phi_2$ (FIG. 11C).

FIG. 11B is a top view of a contour plot 940 of the device 1101 showing a variation in depth between the structures caused by exposing the grating material 212 of the device 1101 to the ion beam 216 (FIG. 2A) when the device 1101 is positioned at the first rotation angle $\phi_1$, according to one embodiment. The contour plot 940 is the same contour plot from FIG. 9A.

FIG. 11C is a top view of a contour plot 1240 of the device 1101 showing a variation in depth between the structures caused by exposing the grating material 212 of the device 1101 to the ion beam 216 (FIG. 2A) when the device 1101 is positioned at a second rotation angle $\phi_2$, according to one embodiment. The contour plots 940, 1240 of FIGS. 11B, 11C each show the depth variation caused by exposing previously unexposed grating material 212 to the ion beam 216. Thus, the contour plots 940, 1240 of FIGS. 11B, 11C each show the results in depth variations between the structures (e.g., depth of trenches) on the device 1101 resulting from a single exposure, so the individual effects of these separate exposures on the depth variations on the device 1101 can be more easily understood. FIG. 11A shows the results in depth variations between the structures on the device 1101 resulting from the exposure that generates structures with depths between the structures according to the contour plot 940 of FIG. 11B combined with the exposure that generates structures with depths between the structures according to the contour plot 1240 of FIG. 11C. This combined exposure process results in the structures with a depth between the structures that varies in multiple dimensions (i.e., in the Y-direction and the Z-direction). This combined exposure process is explained in greater detail with reference to the process flow diagram of FIG. 12.

Figure 11D:
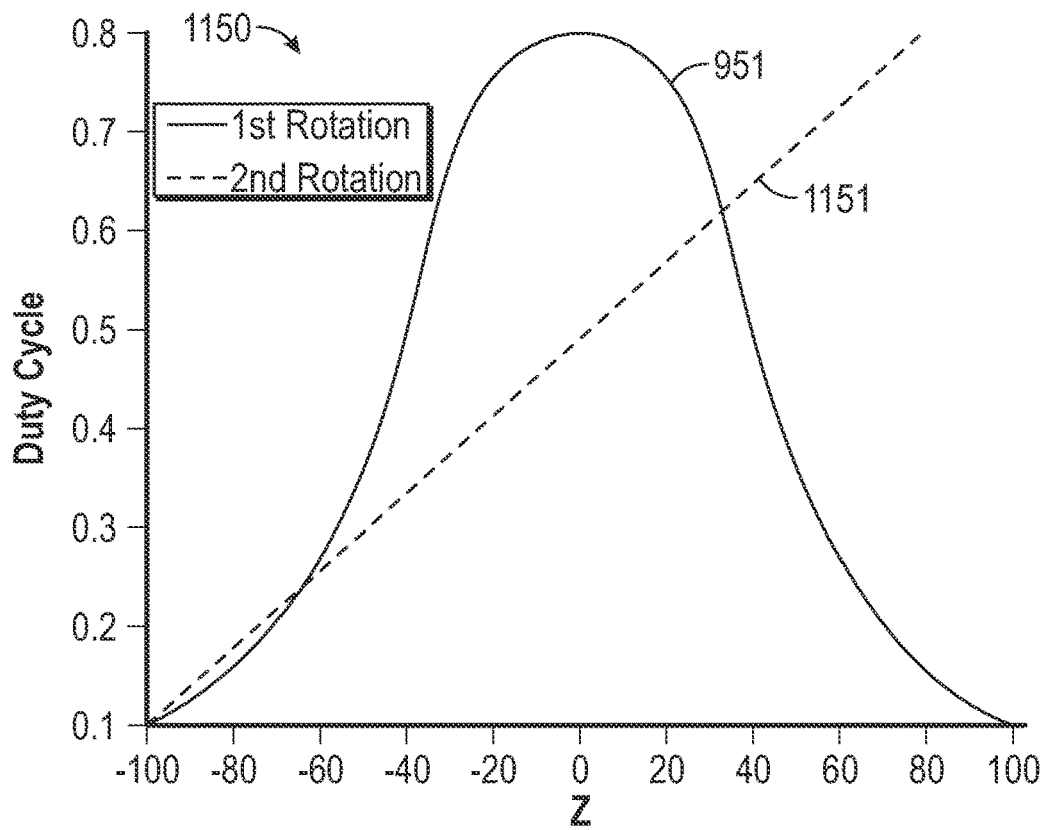
FIG. 11D shows a plot of how a duty cycle of the ion beam can be varied across the device to create the depth variation between the structures shown in the contour plots of FIGS. 11B, 11C, according to one embodiment.

FIG. 11D shows a plot 1150 of how a duty cycle of the ion beam 216 can be varied across the device 1101 to create the depth variation between the structures shown in the contour plots 940, 1240 of FIGS. 11B, 11C, according to one embodiment. To generate the structures with the depth variation between the structures according to the contour plot 940 of FIG. 11B, a duty cycle of the ion beam 216 can be varied in the Z-direction of FIG. 11B across the device 1101 according to the duty cycle profile 951 previously shown in FIG. 9B. Additional details relating to generating the depth variation according to the contour plot 940 and the duty cycle profile 951 are described above in reference to FIGS. 9A and 9B and are not repeated here.

To generate the structures with the depth variation between the structures according to the contour plot 1240 of FIG. 11C, a duty cycle of the ion beam 216 can be varied in the Z-direction of FIG. 11C across the device 1101 according to a duty cycle profile 1151. The duty cycle profile 1151 shows how the duty cycle of the ion beam 216 can be gradually increased from a low duty cycle of about 0.1 at a −100 Z-position to a high duty cycle of about 0.8 at a +100 Z-position. The duty cycle of the ion beam 216 can increase with a linear slope or substantially linear slope along the duty cycle profile 1151. As shown in the contour plot 1240 of FIG. 11C, the depth between the structures (e.g., depth of the trenches) increases as the duty cycle increases in the Z-direction. For example, the contour plot 1240 shows seven sections 1211-1217 with the depth between the structures gradually increasing from the first section 1211 to the seventh section 1217.

Although the contour plot 1240 shown in FIG. 11C shows sections with different discrete depths, the depths of the sections 1211-1217 can gradually change between adjacent sections and within the sections as the duty cycle gradually changes as shown in the duty cycle profile 1151 of FIG. 11D. Also as mentioned above, varying the duty cycle of the ion beam 216 is only one method of varying the depth between the structures. For example, in other embodiments a time in which the ion beam 216 is focused on different portions of the device 1101 can be varied while using a constant duty cycle to form the structures with depths between the structures that vary. In still other embodiments, a power (e.g., voltage and/or current) applied to generate the ion beam 216 can be varied to generate the depth variation shown in the contour plot 1240 of FIG. 11C.

Figure 12:
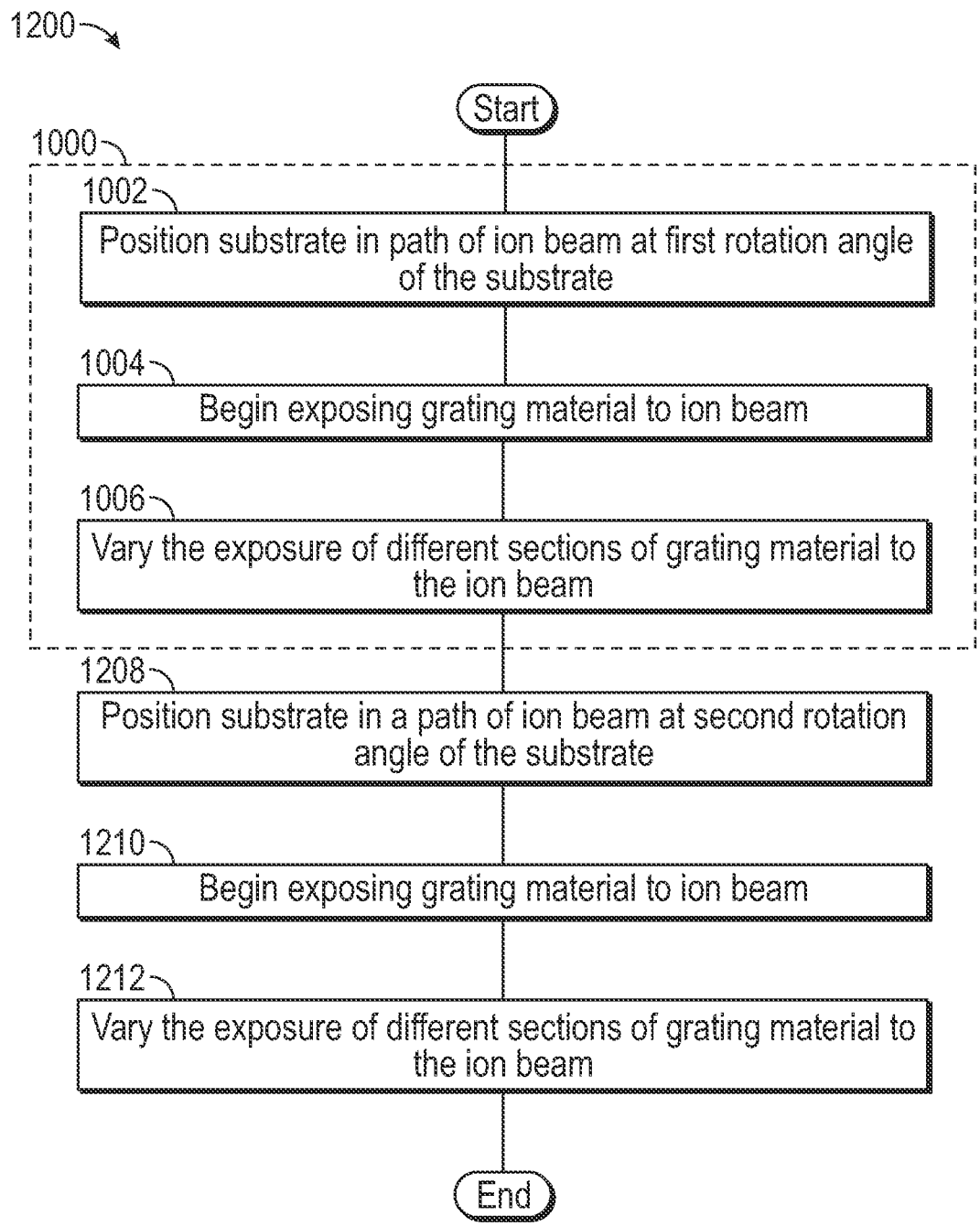
FIG. 12 is a process flow diagram of a method for forming the device shown in FIG. 11A, according to one embodiment.

FIG. 12 is a process flow diagram of a method 1200 for forming the device 1101 shown in FIG. 11A, according to one embodiment. The method 1200 is described in reference to FIGS. 2A, 3, 10, 11A-11D, and 12.

The method 1200 begins by executing the method 1000 described above in reference to FIG. 10. Although the method 1000 is repeated at the beginning of the method 1200 some differences are worth noting. The method 1000 is performed on the device 900 while the method 1200 is performed on the device 1101. For clarity, the operations of the method 1000 are repeated here to clarify how the method 1000 is performed as part of the method 1200 on the device 1101.

At block 1002, the device 1101 is positioned in the path of the ion beam 216 (FIG. 2A) on the platen 206 at the first rotation angle $\phi_1$. The first rotation angle $\phi_1$ can be determined from the Rotation Angle Equation [$\phi_1 = \cos^{-1}(\tan(\vartheta')/\tan(\vartheta))$] based on the second ion beam angle $\vartheta$ (see FIG. 2A) and the desired slant angle $\vartheta'$ (see e.g., FIG. 9C) of the structures to be formed on the device 1101. In some embodiments, the notch 907 can be used to align the device 1101 to be positioned at the first rotation angle $\phi_1$.

At block 1004, at the beginning of a first time period, the ion beam 216 is applied to expose the grating material 212 (first material) disposed across the YZ plane (first plane) to the ion beam 216 at the second ion beam angle $\vartheta$ relative to the surface normal 218 of the substrate 210 to form the structures in the grating material 212 (first material) when the device 1101 is positioned at the first rotation angle $\phi_1$ between the ion beam 216 and the grating vector (e.g., grating vector 308) (also referred as first vector). The grating vector (e.g., grating vector 308) (first vector) is perpendicular to a direction in which the first plurality of structures extend across the YZ plane (first plane). The structures are formed to have the slant angle $\vartheta'$ relative to the surface normal 218 of the device 1101. Although not required, the first rotation angle $\phi_1$ as shown is the same as the rotation angle $\phi_1$ described above in reference to FIG. 9A. Thus, the slant angle $\vartheta'$ of the structures formed on the device 1101 at block 1002 are formed to have the same angle as the slant angle $\vartheta'$ of the structures 906 shown in FIG. 9C. In one embodiment, the ion beam 216 can be initially directed at the bottom seventh section $917_2$, for example aligned with the −100 Z position as shown in FIG. 11B.

At block 1006, the ion beam 216 can be directed incrementally at different portions of the device 1101. For example, the ion beam 216 can be incrementally exposed to the grating material of the bottom sections $917_2$-$912_2$ of the device 900, followed by the center first section 911, and then followed by the top sections $912_1$-$917_1$. The duty cycle of the ion beam 216 can be varied as shown in the duty cycle profile 951 of FIG. 11D to create the structures with depths between the structures that vary according to the contour plot 940 shown in FIG. 11B. In some embodiments, the ion beam 216 can be scanned in the Z-direction with a varying duty cycle according to the duty cycle profile 951 across the device 1101, which can be disposed on a stationary platen 206. In other embodiments, the device 1101 can be translated in the Z-direction to expose the different sections to the ion beam 216.

At block 1208, the device 1101 is positioned on the platen 206 at a second rotation angle $\phi_2$ between the ion beam 216 and the grating vector (first vector) of the structures during the second time period. The second rotation angle $\phi_2$ can be the negative angle of the first rotation angle $\phi_1$. The second rotation angle $\phi_2$ can also be described as being congruent with the first rotation angle $\phi_1$. In some embodiments, the grating vector (see e.g., grating vector 308 of FIG. 3) can be aligned with the notch 907 (see FIG. 9A). In these embodiments with the notch 907 aligned with the grating vector, the device 1101 can be positioned at the first rotation angle $\phi_1$ relative to the notch 907 during block 1002 of method 1200 and then positioned at the negative of the first rotation angle $\phi_1$ (i.e., the second rotation angle $\phi_2$) at block 1208. For example, referring to FIGS. 11B, 11C, at block 1002 of the method 1200, the device 1101 can be positioned at +55°, and at block 1208 the device 1101 can be positioned at −55°. Positioning the device 1101 at the second rotation angle $\phi_2$, which is the negative angle of the first rotation angle $\phi_1$, produces structures on the device 1101 having the same slant angle $\vartheta'$ as the structures generated when the device 1101 is positioned at the first rotation angle $\phi_1$.

At block 1210, at the beginning of a second time period, the ion beam 216 is applied to expose the grating material 212 to the ion beam 216 at the second ion beam angle $\vartheta$ relative to the surface normal 218 of the substrate 210 to form the structures in the grating material 212 when the device 1101 is positioned at the second rotation angle $\phi_2$. The structures are formed to have the slant angle $\vartheta'$ relative to the surface normal 218 of the device 1101. In one embodiment, the ion beam 216 can be initially directed at the first section 1211, for example aligned with the −100 Z position as shown in FIG. 11C.

At block 1212, the ion beam 216 can be directed incrementally at different portions of the device 1101. For example, the ion beam 216 can be incrementally exposed to the grating material of the sections 1211-1217 starting with the first section 1211 and finishing with the seventh section 1217. In some embodiments, the ion beam 216 can be scanned in the Z-direction with a varying duty cycle according to the duty cycle profile 1151 across the device 1101, which can be disposed on a stationary platen 206. In other embodiments, the device 1101 can be translated in the Z-direction to expose the different sections to the ion beam 216.

The duty cycle of the ion beam 216 can be varied as shown in the duty cycle profile 1151 of FIG. 11D to create the structures with depths between the structures that vary according to the contour plot 1240 shown in FIG. 11C. Note, as described above the contour plot 1240 shows the depth between the structures on previously unexposed grating material. Furthermore, the contour plot 1140 of FIG. 11A shows the depth between the structures resulting from the first exposure (i.e., blocks 1002-1006 of method 1200) according to the first duty cycle profile 951 combined with the second exposure (i.e., blocks 1208-1212 of method 1200) according to the second duty cycle profile 1151.

Exposing grating material 212 from the −100 Z-position to the +100 Z-position as shown in FIGS. 11B and 11C results in exposing some portions of the grating material 212 to two exposures while exposing other portions of the grating material 212 to only one exposure. For example, a central portion 1181 (FIG. 11A) of the grating material 212 is exposed to the ion beam 216 when the device is positioned at the first rotation angle $\phi_1$ as shown in FIG. 11B, and the central portion 1181 (FIG. 11A) of the grating material 212 is exposed to the ion beam 216 when the device 1101 is positioned at the second rotation angle $\phi_2$ as shown in FIG. 11C. Conversely, a first portion 1191 (FIG. 11A) of the grating material 212 is exposed to the ion beam 216 when the device is positioned at the first rotation angle $\phi_1$ as shown in FIG. 11B, but the first portion 1191 (FIG. 11A) of the grating material 212 is not exposed to the ion beam 216 when the device 1101 is positioned at the second rotation angle $\phi_2$ as shown in FIG. 11C. Similarly, a second portion 1192 (FIG. 11A) of the grating material 212 is not exposed to the ion beam 216 when the device is positioned at the first rotation angle $\phi_1$ as shown in FIG. 11B, but the second portion 1192 (FIG. 11A) of the grating material 212 is exposed to the ion beam 216 when the device 1101 is positioned at the second rotation angle $\phi_2$ as shown in FIG. 11C. Varying the exposure of the grating material 212 to the ion beam 216 between areas of double exposure (e.g., central portion 1181) and areas of single exposure (e.g., portions 1191, 1192) can allow for additional control over the depth profile of the structures produced by the method 1200 relative to a process that only uses single exposure or only double exposure.

Method 1200 is described as using a first duty cycle profile 951 for the first exposure (i.e., blocks 1002-1006 of method 1200) and a second duty cycle profile 1151 for the second exposure (i.e., blocks 1208-1212 of method 1200). However, benefits can also be obtained from using two exposures at two rotation angles, such as the first rotation angle $\phi_1$ and the second rotation angle $\phi_2$, even when the duty cycle is constant across a portion of the grating material. For example, if a same duty cycle of the ion beam 216 is used on the central portion 1181 for two exposures, the roughness of the sidewalls of the structures (e.g., fins of one or more gratings) can be reduced (i.e., made to be smoother). For example, referring to FIG. 9C, the roughness of the first surface 901 and the second surface 902 can be improved by performing two exposures at a same duty cycle, for example at the first rotation angle $\phi_1$ and the second rotation angle $\phi_2$ described above. This double exposure process at a same duty cycle can also provide benefits when a variable depth between the structures is not needed. For example if a first exposure at the first rotation angle $\phi_1$ removes grating material 212 down to the etch stop layer 211 (FIG. 2A), a second exposure at the second rotation angle $\phi_2$ (i.e., the negative angle of the first rotation angle $\phi_1$) can improve the roughness of the sidewalls of the structures while not having an effect on the depth between the structures.

While the foregoing is directed to examples of the present disclosure, other and further examples of the disclosure may be devised without departing from the basic scope thereof, and the scope thereof is determined by the claims that follow.

What is claimed is:

1. A method comprising:
exposing a first material disposed across a first plane on a first substrate during a first time period to an ion beam to form a first plurality of structures in the first material, the ion beam directed at the first material at an ion beam angle $\vartheta$ relative to a surface normal of the first substrate, wherein
the first substrate is positioned at a first rotation angle $\phi_1$ between the ion beam and a first vector of the first plurality of structures during the first time period,
the first vector is perpendicular to a direction in which the first plurality of structures extend across the first plane,
the first material is exposed to the ion beam incrementally along a first direction during the first time period, and
exposure of the first material to the ion beam is varied along the first direction to generate a depth variation between the first plurality of structures in the first direction; and
exposing the first material disposed to the ion beam during a second time period to modify the depth of at least some of the first plurality of structures, wherein
the substrate is positioned at a second rotation angle $\phi_2$ between the ion beam and the first vector of the first plurality of structures during the second time period,
the second rotation angle $\phi_2$ is the negative angle of the first rotation angle $\phi_1$.

2. The method of claim 1, wherein
the first plurality of structures are formed to have a first slant angle $\vartheta_1'$ relative to a surface normal of the first substrate,
the first rotation angle $\phi_1$ is selected by an equation $\phi_1 = \cos^{-1}(\tan(\vartheta_1')/\tan(\vartheta))$, and
the depths of the first plurality of structures are modified during the second period while maintaining the first slant angle $\vartheta_1'$ of the first plurality of structures.

3. The method of claim 1, wherein a duty cycle used to generate the ion beam is varied for different sections of the first material to generate the depth variation between the first plurality of structures as the first material is exposed to the ion beam incrementally along the first direction.

4. The method of claim 1, wherein a time of exposure to the ion beam is varied for different sections of the first material to generate the depth variation between the first plurality of structures as the first material is exposed to the ion beam incrementally along the first direction.

5. The method of claim 1, wherein a power used to generate the ion beam is varied for different sections of the first material to generate the depth variation between the first plurality of structures as the first material is exposed to the ion beam incrementally along the first direction.

6. The method of claim 1, wherein the first substrate is positioned at the first rotation angle $\phi_1$ on a substrate support.

7. The method of claim 6, further comprising
removing the first substrate from the substrate support;
positioning a second substrate on the substrate support; and
exposing a second material disposed across a second plane on the second substrate to the ion beam to form a second plurality of structures in the second material, the ion beam directed at the second material at the ion beam angle $\vartheta$, wherein the second substrate is positioned at a third rotation angle $\phi_3$ between the ion beam and a second vector of the second plurality of structures, the second vector is perpendicular to a direction in which the second plurality of structures extend across the second plane, and positioning the second substrate to be at the third rotation angle $\phi_3$ comprises rotating the substrate support relative to an orientation of the substrate support when the first plurality of structures were formed on the first substrate.

8. The method of claim 7, wherein the second material is exposed to the ion beam incrementally along the first direction, and exposure of the second material to the ion beam is varied along the first direction to generate a depth variation between the second plurality of structures in the first direction.

9. The method of claim 8, wherein a duty cycle used to generate the ion beam is varied for different sections of the second material to generate the depth variation of the second plurality of structures as the second material is exposed to the ion beam incrementally along the first direction.

10. The method of claim 7, wherein the second plurality of structures are formed to have a second slant angle $\vartheta_2'$ relative to a surface normal of the second substrate, and the third rotation angle $\phi_3$ is selected by an equation $\phi_3 = \cos^{-1}(\tan(\vartheta_2')/\tan(\vartheta))$.

11. A method comprising:

exposing a first material disposed across a first plane on a substrate to an ion beam during a first time period to form a first plurality of structures in the first material, the ion beam directed at the first material at an ion beam angle $\vartheta$ relative to a surface normal of the substrate, wherein the substrate is positioned at a first rotation angle $\phi_1$ between the ion beam and a first vector of the first plurality of structures during the first time period and the first vector is perpendicular to a direction in which the first plurality of structures extend across the first plane; and exposing the first material disposed to the ion beam during a second time period to modify the depth of at least some of the first plurality of structures, wherein the substrate is positioned at a second rotation angle $\phi_2$ between the ion beam and the first vector of the first plurality of structures during the second time period, and the second rotation angle $\phi_2$ is the negative angle of the first rotation angle $\phi_1$.

12. The method of claim 11, wherein a first section of the first material is exposed to the ion beam during the first time period, a second section of the first material is exposed to the ion beam during the second time period, and the second section includes at least a portion that was unexposed to the ion beam during the first time period.

13. The method of claim 12, wherein the first section and the second section share a common portion.

14. The method of claim 11, wherein the first material is exposed to the ion beam incrementally along a first direction during the first time period, and exposure of the first material to the ion beam is varied along the first direction during the first time period to generate a depth variation between the first plurality of structures in the first direction.

15. The method of claim 14, wherein the first material is exposed to the ion beam incrementally along the first direction during the second time period, and exposure of the first material to the ion beam is varied along the first direction during the second time period to generate a modified depth variation between the first plurality of structures in the first direction.

16. The method of claim 11, wherein the first plurality of structures are formed to have a first slant angle $\vartheta_1'$ relative to a surface normal of the substrate during the first time period, the first rotation angle $\phi_1$ is selected by an equation $\phi_1 = \cos^{-1}(\tan(\vartheta_1')/\tan(\vartheta))$, and exposing the first plurality of structures modifies the depths of at least some of the first plurality of structures during the second period while maintaining the first slant angle $\vartheta_1'$ of the first plurality of structures.

17. A method comprising:

exposing a first material disposed across a first plane on a substrate to an ion beam during a first time period to form a first plurality of structures in the first material, the ion beam directed at the first material at an ion beam angle $\vartheta$ relative to a surface normal of the substrate, wherein the substrate is positioned at a first rotation angle $\phi_1$ between the ion beam and a first vector of the first plurality of structures during the first time period and the first vector is perpendicular to a direction in which the first plurality of structures extend across the first plane; and exposing the first material disposed to the ion beam during a second time period, wherein the substrate is positioned at a second rotation angle $\phi_2$ between the ion beam and the first vector of the first plurality of structures during the second time period, the second rotation angle $\phi_2$ is the negative angle of the first rotation angle $\phi_1$, a duty cycle used to generate the ion beam is varied according to a first profile during the first time period, and the duty cycle used to generate the ion beam is varied according to a second profile during the second time period.

18. A method comprising:

exposing a first material disposed across a first plane on a substrate to an ion beam during a first time period to form a first plurality of structures in the first material, the ion beam directed at the first material at an ion beam angle $\vartheta$ relative to a surface normal of the substrate, wherein the substrate is positioned at a first rotation angle $\phi_1$ between the ion beam and a first vector of the first plurality of structures during the first time period, the first vector is perpendicular to a direction in which the first plurality of structures extend across the first plane, the first plurality of structures are formed to have a first slant angle $\vartheta_1'$ relative to a surface normal of the substrate during the first time period, and the first rotation angle $\phi_1$ is selected by an equation $\phi_1 = \cos^{-1}(\tan(\vartheta_1')/\tan(\vartheta))$; and exposing the first material to the ion beam during a second time period, wherein the substrate is positioned at a second rotation angle $\phi_2$ between the ion beam and the first vector of the first plurality of structures during the second time period, wherein the second rotation angle $\phi_2$ is the negative angle of the first rotation angle $\phi_1$, a duty cycle used to generate the ion beam is varied according to a first profile during the first time period, and the duty cycle used to generate the ion beam is varied according to a second profile during the second time period.

19. The method of claim 18, wherein a first section of the first material is exposed to the ion beam during the first time period, a second section of the first material is exposed to the ion beam during the second time period, and the second section includes at least a portion that was unexposed to the ion beam during the first time period.

20. The method of claim 19, wherein the first section and the second section share a common portion.

* * * * *